United States Patent
Yamana et al.

(10) Patent No.: US 9,640,783 B2
(45) Date of Patent: May 2, 2017

(54) LIGHT EMITTING DEVICE WITH REFLECTIVE LAYER INCLUDING FILLER PARTICLES

(71) Applicant: Panasonic Intellectual Property Management Co., Ltd., Osaka (JP)

(72) Inventors: Masahito Yamana, Hyogo (JP); Tetsushi Konda, Kyoto (JP); Tatsuya Okuno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/846,663

(22) Filed: Sep. 4, 2015

(65) Prior Publication Data

US 2016/0079479 A1 Mar. 17, 2016

(30) Foreign Application Priority Data

Sep. 17, 2014 (JP) .................. 2014-188586
Sep. 17, 2014 (JP) .................. 2014-188587

(51) Int. Cl.
*H01L 51/52* (2006.01)

(52) U.S. Cl.
CPC ...... *H01L 51/5275* (2013.01); *H01L 51/5268* (2013.01); *H01L 51/5271* (2013.01)

(58) Field of Classification Search
CPC .......... H01L 51/5271; H01L 51/5268
See application file for complete search history.

(56) References Cited

U.S. PATENT DOCUMENTS

| | | | |
|---|---|---|---|
| 2008/0272689 A1 | 11/2008 | Ide et al. | |
| 2010/0060142 A1* | 3/2010 | Itou | B82Y 20/00 313/498 |
| 2010/0225229 A1* | 9/2010 | Hosoda | B82Y 20/00 313/504 |
| 2011/0024779 A1* | 2/2011 | Nakamura | B82Y 20/00 257/98 |
| 2013/0077321 A1* | 3/2013 | Sato | H01L 33/60 362/297 |
| 2013/0099210 A1* | 4/2013 | Ikeda | H01L 51/5271 257/40 |

(Continued)

FOREIGN PATENT DOCUMENTS

| | | |
|---|---|---|
| JP | 2007-200597 | 8/2007 |
| JP | 2009-076452 | 4/2009 |

(Continued)

*Primary Examiner* — Minh-Loan Tran
*Assistant Examiner* — Farid Khan
(74) *Attorney, Agent, or Firm* — McDermott Will & Emery LLP

(57) ABSTRACT

A light-emitting device according to an aspect of the present disclosure includes a light transmissive first electrode layer, a light transmissive second electrode layer, an electroluminescent layer between the first electrode layer and the second electrode layer, and a reflective layer located on a side opposite to the electroluminescent layer with respect to the second electrode layer. The reflective layer includes a base material having a refractive index equal to or higher than a refractive index of the electroluminescent layer, and fillers each having a refractive index different from that of the base material.

18 Claims, 10 Drawing Sheets

(56) References Cited

U.S. PATENT DOCUMENTS

| | | | |
|---|---|---|---|
| 2015/0008409 A1* | 1/2015 | Ito | H01L 51/5275 257/40 |
| 2015/0048402 A1* | 2/2015 | Urano | H01L 33/60 257/98 |
| 2015/0372258 A1* | 12/2015 | Mizuno | H01L 51/5218 257/40 |
| 2016/0126481 A1* | 5/2016 | Lecamp | H01L 51/0096 428/212 |
| 2016/0204384 A1* | 7/2016 | Sekine | H01L 51/5275 257/40 |

FOREIGN PATENT DOCUMENTS

| | | |
|---|---|---|
| JP | 2011-233288 | 11/2011 |
| WO | 2005/094130 | 10/2005 |

\* cited by examiner

US 9,640,783 B2

LIGHT EMITTING DEVICE WITH REFLECTIVE LAYER INCLUDING FILLER PARTICLES

BACKGROUND

1. Technical Field

The present disclosure relates to light-emitting devices such as organic electroluminescence devices.

2. Description of the Related Art

Organic electroluminescence devices (hereinafter, written as "organic EL devices") typically include an anode, a cathode and an electroluminescent layer disposed between the electrodes. The electroluminescent layer includes organic EL materials. Double-side-emission organic EL devices emit light from both the anode side and the cathode side, whilst in single-side-emission devices, light is emitted from only one of these electrode sides.

Single-side-emission organic EL devices typically include a transparent electrode through which light is emitted, and a metal electrode which serves as a reflective layer.

However, the light extraction efficiency is decreased by the absorption of light by the metal electrode and also by the loss of surface plasmon at the metal electrode. Here, the term "light extraction efficiency" in an organic EL device indicates the ratio of the number of photons released from the light extraction surface of the organic EL device to the atmosphere, relative to the number of photons generated in the electroluminescent layer.

Japanese Patent No. 4742880 and Japanese Unexamined Patent Application Publication No. 2011-233288 disclose single-side-emission organic EL devices including a pair of transparent electrodes and a reflective layer disposed opposite to the light extraction surface.

There has been a demand that the light extraction efficiency of light-emitting devices such as organic EL devices be further enhanced.

SUMMARY

One non-limiting and exemplary embodiment provides a novel light-emitting device which allows light generated in an electroluminescent layer to be extracted with high efficiency.

A light-emitting device according to an aspect of the present disclosure includes: a first electrode layer having light transmissivity; a second electrode layer opposed to the first electrode layer, the second electrode layer having light transmissivity; an electroluminescent layer between the first electrode layer and the second electrode layer; and a reflective layer located on a side opposite to the electroluminescent layer with respect to the second electrode layer, wherein the reflective layer includes a base material having a refractive index equal to or higher than a refractive index of the electroluminescent layer, and fillers each having a refractive index different from a refractive index of the base material.

The light-emitting device according to an aspect of the present disclosure allows light generated in the electroluminescent layer to be extracted with high efficiency.

Additional benefits and advantages of the disclosed embodiments will be apparent from the specification and drawings. The benefits and/or advantages may be individually provided by the various embodiments and features of the specification and drawings, and need not all be provided in order to obtain one or more of the same.

DETAILED DESCRIPTION

Underlying Knowledge Forming Basis of the Present Disclosure

Japanese Unexamined Patent Application Publication No. 2011-233288 discloses an organic EL device including a reflective layer disposed on the side opposite to the light extraction surface, and a high-refractive index layer disposed between the reflective layer and a transparent electrode. The high-refractive index layer has a refractive index higher than those of the transparent electrode and the electroluminescent layer. It is also proposed to disperse fine particles having a light-scattering effect in the high-refractive index layer. The reflective layer is a film of a metal material, or a dielectric multilayer film.

Studies by the present inventors have found that the configuration disclosed in the above literature has a risk that the light extraction efficiency may be decreased by the absorption of light by the high-refractive index layer.

When the reflective layer is a metal material, it is difficult to achieve a sufficiently high light extraction efficiency. Of the metal materials, silver provides the highest reflectance. The reflectance of a Ag layer to visible light is about 95%.

When the reflective layer is a dielectric multilayer film, the wavelength dependence and the angle dependence of the dielectric multilayer film may make it difficult to obtain an enhancement in light extraction efficiency in the entire visible light region or in the total luminous flux. Further, the fabrication of multilayer films entails a complicated process.

Japanese Unexamined Patent Application Publication No. 2011-233288 does not disclose any relationships between the refractive index of the electroluminescent layer and the refractive index of the base material of the reflective layer.

Thus, the organic EL device of the publication may fail to achieve high light extraction efficiency in the case where total reflection occurs at the interface between the high-refractive index layer and the reflective layer.

The present inventors have studied configurations of reflective layers that will make it possible to reduce optical loss. As a result, the present inventors have found that light generated in an electroluminescent layer may be extracted with enhanced efficiency by controlling the relationship among the refractive indexes of the electroluminescent layer, a base material in a reflective layer and fillers in the reflective layer.

First Embodiment

Hereinbelow, light-emitting devices of First Embodiment will be described. In the following, organic EL devices will be described as an example of the light-emitting devices.

Figure 1:
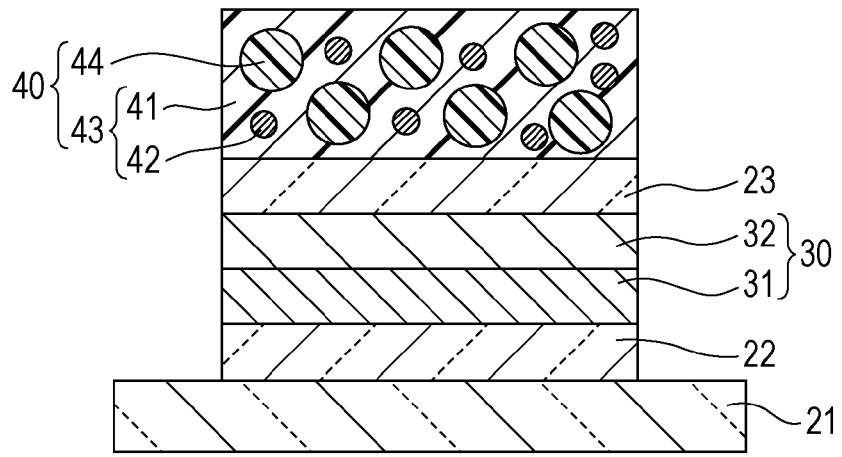
FIG. 1 is a sectional view schematically illustrating an example of organic EL devices in First Embodiment.

FIG. 1 is a schematic sectional view illustrating an example of the organic EL devices in First Embodiment. An organic EL device 100 illustrated in FIG. 1 includes a substrate 21, a first electrode layer 22 supported on the substrate 21, a second electrode layer 23, an organic layer 30 as a functional layer disposed between the first electrode layer 22 and the second electrode layer 23, and a reflective layer 40 disposed on the side of the second electrode layer 23 opposite to the organic layer 30. The organic layer 30 includes an electroluminescent layer 32. In this example, the organic layer 30 includes the electroluminescent layer 32 and a hole injection layer 31.

The first electrode layer 22 and the second electrode layer 23 have light transmissivity. Here, the term "light transmissivity" means that when visible light including a first light wave is passed through the first electrode layer or the second electrode layer, the electrode layer absorbs, for example, not more than 50% of the light. For example, the wavelength of the "first light wave" is the peak wavelength of light emitted from the electroluminescent layer 32. The wavelength of the first light wave is in the band of wavelengths emitted from the electroluminescent layer 32 and may or may not be the peak wavelength. Typically, one or both of the first electrode layer and the second electrode layer are formed of transparent conductive materials.

The reflective layer 40 includes a base material 43 and fillers 44. Here, the refractive index $n_P$ of the base material 43 is equal to or higher than the refractive index $n_{EL}$ of the electroluminescent layer 32. In the example illustrated in FIG. 1, the base material 43 includes a matrix 41 and auxiliary fillers 42 added to the matrix 41. The auxiliary fillers 42 have a refractive index higher than that of the matrix 41. As a result of the addition of the auxiliary fillers 42, the base material 43 can exhibit a desired high refractive index $n_P$. The base material 43 may be free from the auxiliary fillers 42 and may be composed of a single material. The refractive index $n_F$ of the fillers 44 is different from the refractive index $n_P$ of the base material 43. The refractive index $n_F$ of the fillers 44 may be lower or higher than the refractive index $n_P$ of the base material 43. In the present disclosure, the terms "refractive index", "transmittance" and "reflectance" refer to the refractive index, the transmittance and the reflectance with respect to the first light wave present in the light (for example, visible light) emitted from the electroluminescent layer 32.

As already mentioned, light emitted from an electroluminescent layer in a conventional organic EL device may be totally reflected by the surface of, for example, a reflective layer and then may propagate inside the device as waveguided light. Consequently, such light may not be extracted out of the device.

In the organic EL device 100, the refractive index $n_P$ of the base material 43 in the reflective layer 40 is equal to or higher than the refractive index $n_{EL}$ of the electroluminescent layer 32. As a result, light emitted from the electroluminescent layer 32 of the organic EL device 100 enters into the reflective layer 40 without being totally reflected at the interface between the reflective layer 40 and the layer which is in contact with the reflective layer 40 on a side of the organic layer 30. By virtue of this configuration, the amount of waveguided light can be reduced. Note that, in the example illustrated in FIG. 1, the layer which is in contact with the reflective layer 40 on a side of the organic layer 30 corresponds to the second electrode layer 23. Further, since the reflective layer 40 includes the fillers 44 having a different refractive index from the base material 43, the light propagating in the reflective layer 40 is diffusely reflected inside the reflective layer 40. The diffusely reflected light may be extracted from the substrate 21 side. Thus, the organic EL device 100 can achieve an enhanced light extraction efficiency over the conventional organic EL devices.

Since the organic EL device 100 can suppress the total reflection of light at the interface between the reflective layer 40 and the layer which is in contact with the reflective layer 40 on a side of the organic layer 30, the device may be free from a structure for extracting the waveguided light to the outside. For example, the organic EL device 100 may be free from a light extraction layer such as an external scattering layer on the substrate 21 side of the electroluminescent layer 32.

The reflective layer 40 may have a reflectance higher than the reflectance of metal electrodes made of metal materials. The highest reflectance of metal electrodes is 95%, which is provided by silver electrodes. In contrast, the reflective layer 40 can achieve a reflectance above 95%, although variable depending on the difference in refractive index between the base material 43 and the fillers 44 and also depending on the incident angle of light.

Unlike metallic reflective layers or metal electrodes, the reflective layer 40 does not cause a loss by surface plasmon. As compared to a reflective layer composed of a dielectric multilayer film, the reflective layer 40 has a smaller dependence of reflectance on wavelength and incident angle. Consequently, the light extraction efficiency of the organic EL device 100 can be enhanced more reliably.

Unlike metallic reflective layers, the reflective layer 40 reflects light without causing strong interference due to specular reflection. Consequently, the organic EL device 100 can have high robustness to the variation of the thicknesses of the layers.

In a conventional organic EL device, light that has been totally reflected by a reflective layer may propagate as waveguided light and then may repeatedly pass through organic layers and electrode layers. During this process, part of the waveguided light may be absorbed by the organic layers or the electrode layers. In contrast, the organic EL device 100 does not cause total reflection on the surface of the reflective layer 40. Thus, the amount of light absorbed by the organic layer 30 and the electrode layers 22 and 23 can be reduced. Moreover, the organic EL device 100 may be thinned easily without consideration of interference therewithin.

The refractive index of the second electrode layer 23 may be equal to or higher than the refractive index $n_{EL}$ of the electroluminescent layer 32. With this configuration, light emitted from the electroluminescent layer 32 may reach the reflective layer 40 without being totally reflected at the interface between the second electrode layer 23 and the layer which is in contact with the second electrode layer 23 on a side of the organic layer 30. As a result, the light from the electroluminescent layer 32 is allowed to enter into the reflective layer 40 more efficiently. Note that, in the example illustrated in FIG. 1, the layer which is in contact with the second electrode layer 23 on a side of the organic layer 30 corresponds to the organic layer 30 itself.

Although not shown, the organic EL device 100 may further include one or more layers between the second electrode layer 23 and the reflective layer 40. In this case, the refractive indexes of these layers may be equal to or higher than the refractive index $n_{EL}$ of the electroluminescent layer 32. With this configuration, light can be prevented from being totally reflected at an interface located somewhere between the second electrode layer 23 and the reflective layer 40 and consequently the light extraction efficiency may be further enhanced.

[Elements Constituting Organic EL Device 100]
(Substrate 21)

Examples of the substrate 21 include glass substrates and plastic plates. Examples of the materials of the glass substrates include quartz glass, soda-lime glass and alkali-free glass. Examples of the materials of the plastic plates include polyethylene terephthalate, polyethylene naphthalate, polyether sulfone and polycarbonate. When the substrate 21 is a plastic plate, a SiON film or a SiN film may be formed on the surface of the plastic plate. In this manner, the penetration of water may be suppressed. The substrate 21 may be rigid or flexible.

(Organic Layer 30)

The organic layer 30 includes the electroluminescent layer. The organic layer 30 may further include other layers in addition to the electroluminescent layer. Examples of such additional layers include hole injection layers, hole transport layers, interlayers, electron transport layers and electron injection layers.

Examples of the materials of the electroluminescent layer 32 include polyparaphenylenevinylene derivatives, polythiophene derivatives, polyparaphenylene derivatives, polysilane derivatives, polyacetylene derivatives, polyfluorene derivatives, polyvinylcarbazole derivatives, pigments, and polymers of metal complex luminescent materials. Examples of the materials of the electroluminescent layer 32 further include anthracene, naphthalene, pyrene, tetracene, coronene, perylene, phthaloperylene, naphthaloperylene, diphenyl butadiene, tetraphenyl butadiene, coumarin, oxadiazole, bisbenzoxazoline, bisstyryl, cyclopentadiene, quinoline metal complexes, tris(8-hydroxyquinolinato)aluminum complex, tris(4-methyl-8-quinolinato)aluminum complex, tris(5-phenyl-8-quinolinato)aluminum complex, aminoquinoline metal complexes, benzoquinoline metal complexes, tri-(p-terphenyl-4-yl)amine, pyran, quinacridone, rubrene, and derivatives of these materials. Examples of the materials of the electroluminescent layer 32 further include 1-aryl-2,5-di(2-thienyl)pyrrole derivatives, distyrylbenzene derivatives, styrylarylene derivatives and styrylamine derivatives. Examples of the materials of the electroluminescent layer 32 further include compounds which have a group derived from any of these luminescent compounds in the molecule. Examples of the materials of the electroluminescent layer 32 further include phosphorescent materials, and compounds and polymers having a phosphorescent material in the molecule. Examples of the phosphorescent materials include iridium complexes, osmium complexes, platinum complexes and europium complexes.

Examples of the materials of the electron injection layers include metal halides such as metal fluorides and metal chlorides, and metal oxides. Examples of the metal fluorides include lithium fluoride and magnesium fluoride. Examples of the metal chlorides include sodium chloride and magnesium chloride. Examples of the metal oxides include oxides of titanium, zinc, magnesium, calcium, barium and strontium.

The materials of the electron transport layers may be selected from compounds having electron transport properties. Examples of such compounds include metal complexes such as $Alq_3$, and heterocyclic compounds. Examples of the heterocyclic compounds include phenanthroline derivatives, pyridine derivatives, tetrazine derivatives, oxadiazole derivatives and triazole (TAZ) derivatives. The materials of the electron transport layers are not limited to these materials, and any known appropriate materials may be used.

Examples of the materials of the electron injection layers include organic semiconductor materials containing dopants (for example, alkali metals) which promote electron injection.

Examples of the materials of the hole transport layers include low-molecular materials and high-molecular materials having a low LUMO (lowest unoccupied molecular orbital) level. Examples of the materials of the hole transport layers include polyvinylcarbazole (PVCz) and polyarylene derivatives. Examples of the polyarylene derivatives include polypyridines and polyanilines having an aromatic amine in a side chain or in the main chain. The materials of the hole transport layers are not limited to these compounds. Examples of the materials of the hole transport layers further include 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4''-tris(N-(3-methylphenyl)N-phenylamino)triphenylamine (MTDATA), 4,4'-N,N'-dicarbazolebiphenyl (CBP), spiro-NPD, spiro-TPD, spiro-TAD and TNB.

Examples of the materials of the hole injection layer 31 include organic materials including at least one of thiophene, triphenylmethane, hydrazoline, amylamine, hydrazone, stilbene and triphenylamine. Examples of such organic materials include aromatic amine derivatives. Examples of the aromatic amine derivatives include polyvinylcarbazole, polyethylenedioxythiophene:polystyrene sulfonate (PEDOT:PSS) and TPD. These materials may be used singly, or two or more kinds of the materials may be used in combination.

The interlayers may have a carrier blocking function to prevent the leakage of carriers from the electroluminescent layer side. For example, the interlayer is an electron blocking layer that prevents the leakage of electrons from the electroluminescent layer side. By including the interlayer, the organic EL device 100 can achieve an enhancement in luminous efficiency and an increase in life. Examples of the materials of the interlayers include polyarylamine, polyfluorene, polyvinylcarbazole, derivatives of these compounds, and triphenyldiamine derivatives.

The materials of the layers included in the organic layer 30 may be selected appropriately from the aforementioned materials as required. The layers in the organic layer 30 may be formed by wet processes such as coating methods, or dry processes such as vacuum deposition methods and transfer methods. Examples of the coating methods include spin coating methods, spray coating methods, die coating methods, gravure printing methods and screen printing methods.

(First Electrode Layer 22 and Second Electrode Layer 23)

One of the first electrode layer 22 and the second electrode layer 23 serves as an anode and the other as a cathode. For example, the materials of the first electrode layer 22 and the second electrode layer 23 are conductive materials having relatively low light-absorbing properties. Examples of the materials of the first electrode layer 22 and the second electrode layer 23 include metals such as gold (Au) and aluminum (Al), metal oxides such as ITO, conductive polymers, and light transmissive resins containing metal nanoparticles or metal nanowires.

Examples of the metal oxides include ITO (indium-tin oxide), $SnO_2$, ZnO, IZO (indium-zinc oxide) and GZO (gallium-zinc oxide). For example, these materials may be formed into films by a vacuum deposition method or a sputtering method.

Examples of the conductive polymers include polythiophene, polyaniline, polypyrrole, polyphenylene, polyphenylenevinylene, polyacetylene and polycarbazole. To increase the conductivity, the electrode layers may contain dopants. Examples of the dopants include sulfonic acid, Lewis acids, protonic acids, alkali metals and alkaline earth metals.

Examples of the materials of the metal nanoparticles or the metal nanowires include silver, gold and copper. Examples of the light transmissive resins include acrylic resins, polyethylenes, polypropylenes, polyethylene terephthalates, polymethyl methacrylates, polystyrenes, polyethersulfones, polyarylates, polycarbonate resins, polyurethanes, polyacrylonitriles, polyvinyl acetals, polyamides, polyimides, diacrylic phthalate resins, cellulose resins, polyvinyl chlorides, polyvinylidene chlorides, polyvinyl acetates, other thermoplastic resins, and copolymers of two or more kinds of monomers constituting these resins.

When the materials used for the electrode layers are conductive polymer materials or light transmissive resins containing metal nanoparticles or metal nanowires, the electrode layers may be formed by a wet process such as a coating method or a dry process such as a transfer method. Examples of the coating methods include spin coating methods, spray coating methods, die coating methods, gravure printing methods and screen printing methods.

The materials, the thicknesses and the methods for the formation of the first electrode layer 22 and the second electrode layer 23 may be selected so that the light transmittances of these electrode layers will be, for example, 50% or above, and more desirably 70% or above.

In the organic EL device 100, for example, the first electrode layer 22 and the organic layer 30 are formed on the substrate 21 and thereafter the second electrode layer 23 is formed on the organic layer 30. It is therefore sometimes difficult to form the second electrode layer 23 under the same conditions as the first electrode layer 22. In the formation of the second electrode layer 23, conditions such as temperature may be set in consideration of the heat resistance of the organic layer 30. When the second electrode layer 23 is formed by sputtering, the forming conditions thereof may be set in consideration of damage of the organic layer 30 by heating temperature and/or ion collision. When the second electrode layer 23 is formed by coating, the forming conditions thereof may be set in consideration of damage of the organic layer 30 by the permeation of the coating material into the organic layer 30 and/or drying temperature.

For example, the first electrode layer 22 and the second electrode layer 23 may be ITO films. ITO films are crystallized at a heating temperature of about 180° C., and thereby change their characteristics. Typically, ITO films formed at a temperature of 200° C. or above are used as transparent electrodes in bottom-emission organic EL devices. ITO films formed at 200° C. or above have higher conductivity than ITO films formed at a lower temperature, and exhibit high transparency and small light absorption. For example, the first electrode layer 22 is an ITO film formed at a temperature of 200° C. or above. On the other hand, since the second electrode layer 23 is formed on the organic layer 30, the material of the second electrode layer 23 is selected in consideration of the heat resistance of the organic layer 30. For example, the second electrode layer 23 is an ITO film formed at a low temperature (for example, less than 200° C.). Table 1 (described later) shows an example of the refractive indexes and the extinction coefficients of ITO films formed at 300° C. and at room temperature. In Table 1, the extinction coefficient of the ITO film formed at room temperature is an order of magnitude greater than the extinction coefficient of the ITO film formed at 300° C. That is, the extinction coefficient of the ITO film formed at room temperature indicates that the film absorbs more light.

(Reflective Layer 40)

The reflective layer 40 includes a base material 43 and fillers 44 having a different refractive index from the base material 43. The reflective layer 40 may serve as a diffuse reflection layer. The reflective layer 40 may have flexibility. As a result of the addition of the fillers 44 to the base material 43, the reflective layer 40 may exhibit high reflectance. For example, the reflectance of the reflective layer 40 is 60% or more, and desirably 80% or more. For example, the reflective layer 40 may be designed so as to exhibit a reflectance that is not less than the highest reflectance of metals, namely, the reflectance of silver. The reflectance of the reflective layer 40 may be not less than 95%, for example.

The base material 43 has a refractive index that is equal to or higher than the refractive index of the electroluminescent layer 32. As a result, light emitted from the electroluminescent layer 32 enters into the reflective layer 40 without being totally reflected at the interface between the reflective layer 40 and the layer which is contact with the reflective layer 40 on a side of the electroluminescent layer 32. Note that, in the example illustrated in FIG. 1, the layer which is in contact with the reflective layer 40 on a side of the electroluminescent layer 32 corresponds to the second electrode layer 23.

The base material 43 may be composed of more than one material. For example, the base material 43 may include a matrix 41 and auxiliary fillers 42 dispersed in the matrix 41, and the auxiliary fillers 42 may have a higher refractive index than the matrix 41. In this manner, the resultant base material 43 exhibits a higher refractive index than the matrix 41. In the reflective layer 40 having this structure, for example, the refractive index of the base material 43 may be controlled by adjusting the volume ratio of the auxiliary fillers 42 to the base material 43. With this configuration, light from the electroluminescent layer 32 may be incorporated into the reflective layer 40 more efficiently and consequently the light extraction efficiency may be further enhanced.

The refractive index of the base material 43 including the matrix 41 and the auxiliary fillers 42 may be determined using the following equation (1):

(Refractive index of base material 43)=(Volume ratio of matrix 41 to base material 43)×(Refractive index of matrix 41)+(Volume ratio of auxiliary fillers 42 to base material 43)×(Refractive index of auxiliary fillers 42)  (1)

For example, each of the auxiliary fillers 42 has such a size that visible light is not scattered. For example, the average particle diameter of the auxiliary fillers 42 may be 0.005 μm to 0.05 μm. In the present disclosure, the term "average particle diameter" means the peak value in a particle size distribution determined by a dynamic light scattering method.

Examples of the materials of the auxiliary fillers 42 include $TiO_2$ (refractive index: 2.1), $ZrO_2$ (refractive index: 2.5), ITO (refractive index: 2.0), ATO (refractive index: 2.0), ZnO (refractive index: 2.0), $CeO_2$ (refractive index: 2.2) and CdO (refractive index: 2.5). For example, the matrix 41 of the base material 43 has a high refractive index. Examples of the materials of the matrix 41 include fluorene resin compounds and naphthalene resin compounds. The volume ratio of the auxiliary fillers 42 to the base material 43 may be controlled appropriately so that the base material 43 has a desired refractive index. Note that the phrase "volume ratio of the auxiliary fillers 42 to the base material 43" means a ratio of total volume of the auxiliary fillers 42 to volume of the base material 43.

The base material 43 may be composed of a single material without the auxiliary fillers 42. In this case, examples of the materials of the base material 43 include sulfur-modified resin compounds such as thiophene resin compounds.

The reflective layer 40 includes the fillers 44. The fillers 44 have a different refractive index from the base material 43. The refractive index of the fillers 44 may be lower or higher than that of the base material 43. For example, each of the fillers 44 has such a size that visible light is scattered. For example, the average particle diameter of the fillers 44 may be 0.1 μm to 10 μm. With this configuration, the reflective layer 40 may diffusely reflect light from the electroluminescent layer 32 more efficiently.

Examples of the fillers 44 having a lower refractive index than the base material 43 include silica particles, hollow silica particles, hollow acrylic particles, hollow porous acrylic particles and mesoporous silica particles. In hollow particles, the refractive index of air present inside the particles is as low as 1.0 and hence the reflectance of the base material 43 may be increased more effectively. The fillers 44 may have low elasticity in the case where the organic EL device 100 has freely bendability or flexibility in shape. For example, the elastic modulus of the fillers 44 may be 100 MPa or less. Examples of the low-elasticity fillers include silicone resin particles, PTFE resin particles, hollow organic particles such as styrene-acrylic copolymers, and voids. The voids may be formed in the base material 43 by mixing a foaming agent with the base material 43 and performing foaming treatment such as heating. Examples of the fillers 44 having a higher refractive index than the base material 43 include $TiO_2$ particles, $ZrO_2$ particles, hollow $TiO_2$ particles and hollow $ZrO_2$ particles.

The difference in refractive index between the fillers 44 and the base material 43 is, although not particularly limited to, 0.11 or more, and desirably 0.25 or more, for example. With this configuration, the reflective layer 40 may achieve higher reflectance. When the base material 43 includes the matrix 41 and the auxiliary fillers 42, the refractive index of the base material 43 may be controlled by controlling the auxiliary fillers 42. Thus, when the fillers 44 have a lower refractive index than the matrix 41, the difference in refractive index between the fillers 44 and the base material 43 can be enlarged by selecting the material having a high refractive index as the auxiliary fillers 42, thereby enabling reflectance of the reflective layer 40 to be enhanced.

The volume ratio of the fillers 44 to the base material 43 may be controlled appropriately so that a desired reflectance will be obtained. Note that the phrase "volume ratio of the fillers 44 to the base material 43" means a ratio of total volume of the fillers 44 to volume of the base material 43. For example, the volume ratio of the fillers 44 to the base material 43 may be 1% or more. With this configuration, reflective properties may be imparted to the reflective layer 40. The volume ratio of the fillers 44 to the base material 43 may be 10% or more. With this configuration, a high reflectance (for example, 60% or more) may be imparted to the reflective layer 40. The volume ratio of the fillers 44 to the base material 43 may be 30% or less. This configuration facilitates for the auxiliary fillers 42 and the fillers 44 to be dispersed into the matrix 41.

When the reflective layer 40 includes the auxiliary fillers 42 and the fillers 44, the particles may be distinguished by average particle diameter. When, for example, a particle size distribution measured by a dynamic light scattering method has a first peak top in the range of particle diameters of from 0.005 μm to 0.05 μm and a second peak top in the range of from 0.1 μm to 10 μm, the peak including the first peak top corresponds to the auxiliary fillers 42 and the peak including the second peak top corresponds to the fillers 44. The particles having an average particle diameter that is greater than 0.05 μm and is smaller than 0.1 μm are the fillers 44 when the particles cause visible light to be scattered, and are the auxiliary fillers 42 when the particles do not cause the scattering of visible light.

An example of how to form the reflective layer 40 will be described below. In this example, it is assumed that the matrix 41 is a photocurable acrylic resin, the auxiliary fillers 42 are zirconia particles, and the fillers 44 are silicone resin particles.

First, a photocurable acrylic resin composition as the base material 43 is prepared. A dispersion is prepared which includes an organic solvent having a SP value of, for example, 9.5 or less, zirconia particles and a phosphate dispersant. Next, an acrylate and a photoinitiator are added to the dispersion. Subsequently, the organic solvent of the dispersion is evaporated to afford a photocurable acrylic resin composition.

For example, the zirconia particles are "UEP-100" manufactured by DAIICHI KIGENSO KAGAKU KOGYO CO., LTD., with an average primary particle diameter of 10 to 15 nm. For example, the phosphate dispersant is "NUOSPERSE FA-196" manufactured by Elementis Specialties. For example, the organic solvent is ethyl acetate. For example, the acrylate is fluorene acrylate "OGSOL EA-0200" manufactured by Osaka Gas Chemicals Co., Ltd., with a refractive index of 1.62. For example, the photoinitiator is "Darocur 1173" manufactured by BASF Japan Ltd. For example, the dispersion prepared in this case contains 19.0 mass % of the zirconia particles, 1.0 mass % of the phosphate dispersant, and 80 mass % of the organic solvent. Next, a mixture is prepared which contains 50 mass % of the dispersion, 49.5 mass % of the fluorene acrylate, and 0.5 mass % of the photoinitiator. Subsequently, the organic solvent is evaporated, and thereby a photocurable acrylic resin composition having a refractive index of 1.772 with respect to 533 nm wavelength light is obtained.

Secondly, the fillers 44 are added to the base material 43 obtained above. The amount of the fillers 44 is controlled so that the fillers 44 will have a desired volume ratio to the base material 43. For example, the volume ratio of the silicone resin particles to the photocurable acrylic resin composition is 20%. Alternatively, other particles such as $ZrO_2$ particles may be added to the base material 43. After the addition, the fillers 44 and the base material 43 are mixed with each other with a spatula. Subsequently, the base material 43 and the fillers 44 are stirred in a defoaming kneader to give a reflective layer solution.

Thirdly, the reflective layer solution is applied onto the second electrode layer 23 and then the reflective layer solution is cured to form a reflective layer 40. The curing method is not particularly limited. For example, the reflective layer solution may be cured by the irradiation with UV rays.

Second Embodiment

Hereinbelow, organic EL devices of Second Embodiment will be described. The organic EL device of the present embodiment differs from the organic EL device of First Embodiment in that the device includes a low-reflectance layer disposed between the electroluminescent layer 32 and the reflective layer 40, and a light extraction layer disposed on the side of the electroluminescent layer opposite to the reflective layer. For example, the refractive index of the low-reflectance layer is 95% to less than 100% of the refractive index $n_{EL}$ of the electroluminescent layer.

Figure 2:
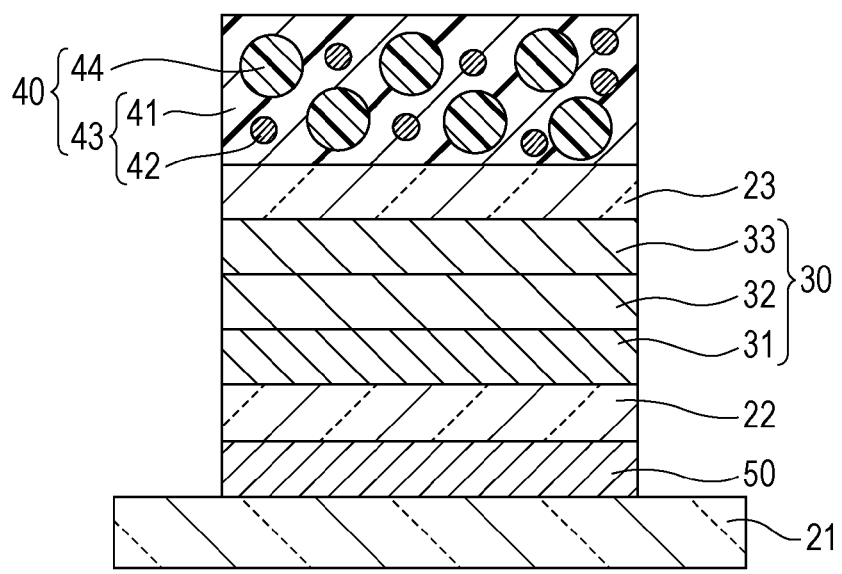
FIG. 2 is a sectional view schematically illustrating an example of organic EL devices in Second Embodiment.

FIG. 2 is a schematic sectional view illustrating an example of the organic EL devices in Second Embodiment. An organic EL device 200 illustrated in FIG. 2 includes a low-reflectance layer 33 located between an electroluminescent layer 32 and a reflective layer 40, and a light extraction layer 50 located between a substrate 21 and a first electrode layer 22. The other configurations are the same as in the organic EL device 100 of First Embodiment and thus the description thereof will be omitted.

The organic EL device 200 can achieve the following effects by having the low-reflectance layer 33 and the light extraction layer 50.

In the organic EL device 100 of First Embodiment, part of the light entering into the second electrode layer 23 and the reflective layer 40 at a high angle may be absorbed by the second electrode layer 23 and/or the base material 43 of the reflective layer 40. The term "high angle" means that the incident angle β relative to the direction of the normal to the principal surface of the substrate 21 is relatively large and is, for example, 70° to less than 90°. The light that has entered into the second electrode layer 23 and the reflective layer 40 at a high angle travels a long distance while propagating in these layers. According to the Lambert's law represented by the equation (2) below, the light that has entered into the second electrode layer 23 and the reflective layer 40 at a high angle is absorbed by these layers in a large amount. That is, an increase in the amount of light entering into the second electrode layer 23 and the reflective layer 40 at a high angle may result in a decrease in light extraction efficiency.

$$\text{Transmittance } T = \exp(-4\pi k d/\lambda) \quad (2)$$

wherein k: extinction coefficient of medium, d: light propagation distance, λ: wavelength of light.

For example, an ITO film formed at a low temperature has a large extinction coefficient. Thus, in the case where the second electrode layer 23 is an ITO film formed at a low temperature, the amount of light absorbed by the second electrode layer 23 is markedly increased in accordance with the light propagation distance.

In contrast, in the organic EL device 200, at least part of the light incident from the electroluminescent layer 32 onto the low-reflectance layer 33 at a high angle of not less than the critical angle is totally reflected at the interface between the layers. The critical angle is an angle determined by the refractive indexes of the low-reflectance layer 33 and the electroluminescent layer 32. The totally reflected light is scattered in the light extraction layer 50 and thereby may be extracted out of the device without propagating as waveguided light. On the other hand, light incident from the electroluminescent layer 32 onto the low-reflectance layer 33 at a low angle of less than the critical angle enters into the reflective layer 40 through the low-reflectance layer 33 and the second electrode layer 23, and then is diffusely reflected by the reflective layer 40. The diffusely reflected light may be extracted out of the device from the substrate 21 side.

In the manner described above, the low-reflectance layer 33 can totally reflect at least part of the light incident from the electroluminescent layer 32 onto the low-reflectance layer 33 at a high angle, thus reducing the amount of light absorbed by the second electrode layer 23 or the reflective layer 40. As a result, the organic EL device 200 can achieve an enhancement in light extraction efficiency.

When, for example, the refractive index of the low-reflectance layer 33 is 95% of the refractive index of the electroluminescent layer 32, the critical angle for the light incident from the electroluminescent layer 32 onto the low-reflectance layer 33 is 72°. Thus, light incident on the low-reflectance layer 33 at an incident angle of 72° or greater is totally reflected by the low-reflectance layer 33. In this case, the reflectance of the low-reflectance layer 33 is not more than 20% ((90°−72°)/90°×100). When, for example, the refractive index of the low-reflectance layer 33 is 95% or more of the refractive index of the electroluminescent layer 32, the critical angle is 72° or more. On the other hand, when the refractive index of the low-reflectance layer 33 is equal to or higher than the refractive index of the electroluminescent layer 32, the low-reflectance layer 33 fails to totally reflect the light incident at a high angle. Thus, the refractive index of the low-reflectance layer 33 is set to less than 100% of the refractive index of the electroluminescent layer 32.

In the example illustrated in FIG. 2, the low-reflectance layer 33 also serves as an electron transport layer. In other words, the layer 33 illustrated in FIG. 2 has electron transporting properties in addition to the aforementioned characteristics. However, the low-reflectance layer 33 in the present embodiment may not have an electron transporting function.

The position of the low-reflectance layer is not limited to the one illustrated in FIG. 2. The low-reflectance layer may enhance light extraction efficiency as long as it is disposed anywhere between the electroluminescent layer 32 and the reflective layer 40. The low-reflectance layer may be disposed between the second electrode layer 23 and the reflective layer 40. In this case, the amount of light absorbed by the reflective layer 40 can be reduced. On the other hand, the low-reflectance layer may be disposed between the second electrode layer 23 and the electroluminescent layer 32. In this case, it is possible to reduce the amount of light absorbed not only by the reflective layer 40 but also by the second electrode layer 23. The organic EL device of the present embodiment may have a single or a plurality of low-reflectance layers.

Figure 3:
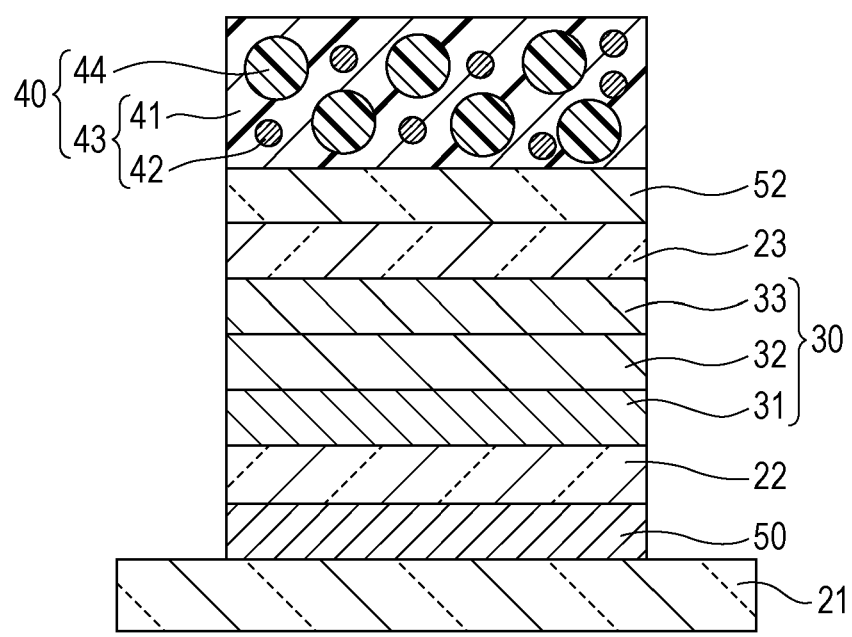
FIG. 3 is a sectional view schematically illustrating another example of organic EL devices in Second Embodiment.

FIG. 3 is a schematic sectional view illustrating another example of the organic EL devices in the present embodiment. An organic EL device 300 illustrated in FIG. 3 includes a low-refractive index layer 52 between a second electrode layer 23 and a reflective layer 40. The low-refractive index layer 52 has a lower refractive index than an electroluminescent layer 32. For example, the low-refractive index layer 52 may have a refractive index that is less than 95% of the refractive index of the electroluminescent layer 32. The other configurations are the same as in the organic EL device 200 illustrated in FIG. 2.

As a result of the organic EL device 300 having the low-refractive index layer 52, part of the light incident from the second electrode layer 23 onto the low-refractive index layer 52 at a high angle may be totally reflected at the interface between these layers. Thus, the organic EL device 300 may prevent the absorption of light by the reflective layer 40 more effectively.

The low-refractive index layer 52 may be any light transmissive layer having a lower refractive index than the electroluminescent layer 32, and the material and the method for the formation of the layer are not particularly limited. The low-refractive index layer 52 may be an inorganic film or an organic film. Examples of the inorganic or organic films include transparent resin layers, transparent films, and transparent glasses. Examples of the inorganic films further include silica films. Such inorganic films and organic films may be formed by coating methods, sputtering methods or deposition methods. Examples of the transparent resins include acrylic resins, epoxy resins and fluororesins. The refractive indexes of these materials are about 1.4. Alternatively, the low-refractive index layer 52 may be a gas layer such as an air layer. For example, the refractive index of an air layer is 1.0. The low-refractive index layer 52 may be a matching oil layer, and its refractive index is, for example, 1.5.

The position of the low-refractive index layer 52 is not limited to the one illustrated in FIG. 3, and the low-refractive index layer 52 may be disposed anywhere between the reflective layer 40 and the electroluminescent layer 32. This configuration allows for the total reflection of light that is incident on the interface between the low-refractive index layer 52 and the layer which is in contact with the low-refractive index layer 52 on a side of the electroluminescent layer 32 at an incident angle of not less than the critical angle. Consequently, it is possible to prevent more effectively the absorption of light by the reflective layer 40 or the second electrode layer 23.

[Elements Constituting Organic EL Devices 200 and 300]

The materials and the configurations of the substrate 21, the first electrode layer 22, the second electrode layer 23 and the organic layer 30 in the organic EL devices 200 and 300 may be the same as described in First Embodiment.

(Low-reflectance Layer 33)

In the example illustrated in FIG. 2, the low-reflectance layer 33 serves as an electron transport layer. That is, the material of the low-reflectance layer 33 may be any of the materials mentioned as examples of the electron transport layers in First Embodiment with the proviso that the material has a refractive index that is 95% to less than 100% of the refractive index of the electroluminescent layer 32. With such a configuration, the low-reflectance layer 33 may have a reflectance of from above 0% to 20%, and thereby the absorption of light by the second electrode layer 23 and the reflective layer 40 may be suppressed.

(Light Extraction Layer 50)

The light extraction layer 50 may be any layer which can disorder the reflection angle and/or the refraction angle of light. For example, the phrase "disorder the reflection angle and/or the refraction angle of light" means to change light entering into the layer at a specific incident angle into a plurality of light waves traveling in different directions. The light extraction layer 50 allows at least part of light that would be totally reflected at an interface between two layers if there was no light extraction layer 50 therebetween, to be transmitted from one of the two layers to the other through the light extraction layer 50.

The structure of the light extraction layer 50 is not particularly limited as long as the light extraction layer 50 can disorder the reflection angle and/or the refraction angle of light incident on the light extraction layer 50. For example, the light extraction layer 50 may have irregularities on its surface. The light extraction layer 50 may include a plurality of media having different refractive indexes, and the interface of such media may have light-reflecting properties. The light extraction layer 50 may contain particles or voids inside the layer, or may be a layer of a mixture of a plurality of materials. The light extraction layer 50 may be a microlens array sheet. For example, the array pitches may be about 10 μm. The light extraction layer 50 may be formed on an irregular substrate 21 so as to have irregularities reflecting the irregularities on the substrate 21. For example, the light extraction layer 50 may be an optical dispersion layer in which light transmissive fine particles such as silica or alumina are dispersed in a light transmissive binder. In the case where the light extraction layer 50 has two layers having different refractive indexes, irregularities may be provided at the interface between the layers.

For example, the light transmittance of the light extraction layer 50 is 50% or more, and desirably 80% or more. The light extraction layer 50 may change the directionality of light by any magnitude without limitation. For example, light incident on the light extraction layer 50 enters into the light extraction layer 50 without being totally reflected by the surface of the light extraction layer 50. In order to reduce the occurrence of total reflection of light at the interface between the light extraction layer 50 and the first electrode layer 22, the refractive index of the light extraction layer 50 may be equal to or higher than the refractive index of the first electrode layer 22.

Specific examples of the light extraction layer 50 will be described below.

(Specific Example 1 of Light Extraction Layer 50)

The light extraction layer 50 may have a light scattering layer. For example, the light scattering layer may include a light scattering region and a light transmissive region in the same plane. Both the light scattering region and the light transmissive region may include light scattering particles and a binder resin. In this case, for example, the light transmissive region contains a lower proportion of light scattering particles than the light scattering region. For example, a method for forming such a light scattering layer is disclosed in U.S. Patent Application No. 2011/0024779, the entire contents of which are incorporated herein by reference and are deemed to constitute part of the present disclosure.

(Specific Example 2 of Light Extraction Layer 50)

The light extraction layer 50 may include a first layer disposed on the substrate 21, and a second layer disposed on the first layer. The second layer may have a higher refractive index than the first layer. The interface between the first layer and the second layer may have irregularities.

For example, such a light extraction layer 50 may be produced by a method including: a step of forming a first layer having an irregular surface on the substrate 21; and a step of burying the irregularities with a high-refractive index material to form a second layer on the first layer. Alternatively, for example, the light extraction layer 50 may be produced by a method including: a step of forming, on the substrate 21, the reflective layer 40, the second electrode layer 23, the organic layer 30 and the first electrode layer 22;

a step of forming a second layer having an irregular surface on the first electrode layer 22; and a step of forming a first layer so as to bury the irregularities.

Examples of the substrate 21 include glass substrates and resin substrates. For example, the refractive index of the substrate 21 is about 1.5 to 1.65. The material of the first layer may be any material having a lower refractive index than the substrate 21. Examples of the materials of the first layer include inorganic materials such as glass and $SiO_2$ (e.g., quartz), and resins. Examples of the materials of the second layer include inorganic materials having a high refractive index, and resins having a high refractive index. Examples of the inorganic materials having a high refractive index include ITO (indium tin oxide), $TiO_2$ (titanium oxide), SiN (silicon nitride), $Ta_2O_5$ (tantalum pentoxide) and $ZrO_2$ (zirconia). For example, the refractive index of the second layer may be 1.73 or more.

When the materials used for the first layer and the second layer are inorganic materials, a relatively expensive technique such as cutting or semiconductor processing may be required. When, on the other hand, the materials of the first layer and the second layer are resin materials, the light extraction layer 50 may be formed by a relatively inexpensive technique such as coating, nanoimprinting or spin coating.

VARIOUS EXAMPLES

Example 1 and Comparative Example 1

Hereinbelow, a specific example of the organic EL devices of First Embodiment will be described as Example 1 with reference to the drawings.

Figure 4:
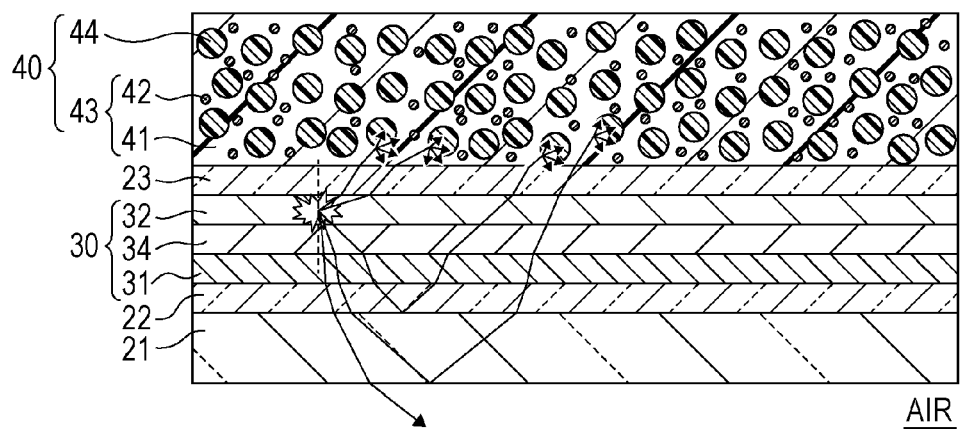
FIG. 4 is a schematic sectional view of an organic EL device of Example 1.
Figure 5:
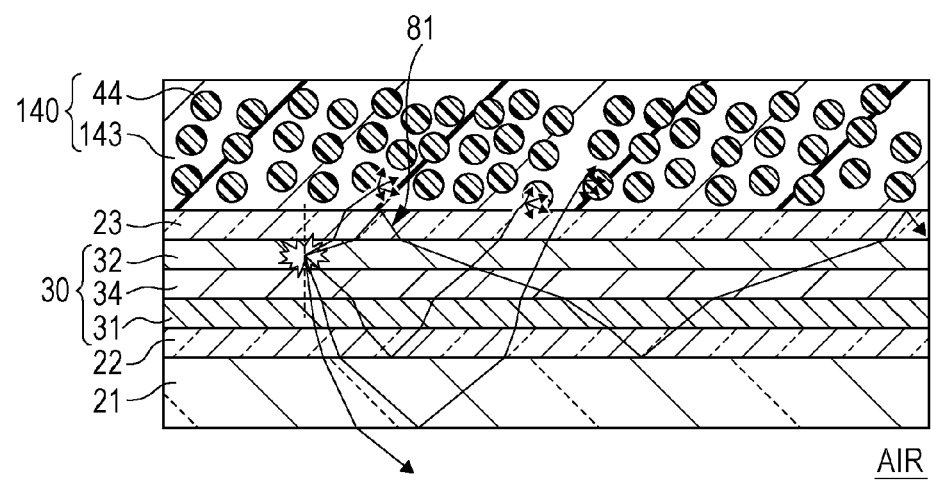
FIG. 5 is a schematic sectional view of an organic EL device of Comparative Example 1.

FIG. 4 is a schematic sectional view illustrating an organic EL device 101 of Example 1. FIG. 5 is a schematic sectional view illustrating an organic EL device 501 of Comparative Example 1. The organic EL device 501 of Comparative Example 1 has a reflective layer 140 which includes a base material 143 having a lower refractive index than an electroluminescent layer 32.

Table 1 describes the refractive indexes and the extinction coefficients of the materials for the layers used in Example 1 and Comparative Example 1. The refractive indexes and the extinction coefficients shown in Table 1 are values with respect to 533 nm wavelength light, which corresponds to the peak wavelength of light emitted from an $Alq_3$ layer as the electroluminescent layer 32.

TABLE 1

| Materials | Refractive indexes | Extinction coefficients |
|---|---|---|
| Air | 1 | 0 |
| Glass | 1.52 | 0 |
| ITO film formed at 300° C. | 1.821 | 0.0059 |
| $MoO_3$ | 2.143 | 0.0136 |
| α-NPD | 1.794 | 0.0069 |
| $Alq_3$ | 1.768 | 0 |
| TAZ | 1.718 | 0 |
| ITO film formed at room temperature | 2.050 | 0.0304 |
| Acrylic resin | 1.6 | 0 |
| Acrylic resin + $ZrO_2$ particles | 1.772 | 0 |
| $ZrO_2$ particles | 2.1 | 0 |
| Silicone resin particles | 1.4 | 0 |
| Imide resin | 1.78 | 0 |

Example 1

In the organic EL device 101 of Example 1, as illustrated in FIG. 4, the substrate 21 is a glass substrate, the first electrode layer 22 is an ITO layer formed at 300° C., the hole injection layer 31 is a $MoO_3$ layer, the hole transport layer 34 is an α-NPD layer, the electroluminescent layer 32 is an $Alq_3$ layer, and the second electrode layer 23 is an ITO layer formed at room temperature.

The reflective layer 40 includes a base material 43 having a higher refractive index than the electroluminescent layer 32, and fillers 44. The base material 43 includes a matrix 41 and auxiliary fillers 42 dispersed in the matrix 41. The material of the matrix 41 is an acrylic resin, and the auxiliary fillers 42 are $ZrO_2$ particles. In this case, the $ZrO_2$ particles heighten the refractive index of the base material 43. For example, the refractive index of the base material 43 is 1.772. The fillers 44 are silicone resin particles. The reflective layer 40 in this example may be formed by the method described hereinabove.

To allow the organic EL device 101 to be actually operated, an electron injection layer may be sometimes disposed between the electroluminescent layer 32 and the second electrode layer 23. Examples of the materials of the electron injection layer include Li-doped $Alq_3$, and ZnO. The electron injection layer is not shown in the FIG. 4, because the thickness of the electron injection layer is so small (e.g., several nm) that the behavior of light can be negligible.

Comparative Example 1

In the organic EL device 501 of Comparative Example 1, as illustrated in FIG. 5, the reflective layer 140 includes a base material 143 and fillers 44 dispersed in the base material 143. The material of the base material 143 is an acrylic resin, and the fillers 44 are silicone resin particles. The base material 143 of the reflective layer 140 contains no auxiliary fillers, and thus its refractive index is lower than that of the electroluminescent layer 32. For example, the refractive index of the base material 143 is 1.6. The other configurations are the same as in Example 1.

<Behavior of Light Emitted from Electroluminescent Layer>

FIGS. 4 and 5 illustrate the behaviors of light emitted from the electroluminescent layer 32 in Example 1 and Comparative Example 1, respectively.

In Comparative Example 1, as illustrated in FIG. 5, the light is, after entering into the reflective layer 140, diffusely reflected at the interfaces between the fillers 44 and the base material 143 in the reflective layer 140, and then extracted out of the organic EL device 501. However, since the base material 143 of the reflective layer 140 has a refractive index lower than the refractive index of the electroluminescent layer 32, light 81 emitted from the electroluminescent layer 32 is totally reflected by the interface between the second electrode layer 23 and the reflective layer 140. The totally reflected light 81 is totally reflected also at the interface between the first electrode layer 22 and the substrate 21. Consequently, as illustrated in FIG. 5, the light 81 is waveguided in the organic EL device 501 and thus is not extracted out of the device. It is therefore difficult for the organic EL device 501 to achieve a high light extraction efficiency.

In contrast, the base material 43 of the reflective layer 40 in Example 1 has a higher refractive index than the electroluminescent layer 32, and hence no total reflection occurs at the interface between the second electrode layer 23 and the reflective layer 40 as illustrated in FIG. 4. All the light incident on the reflective layer 40 enters into the reflective layer 40 and then is diffusely reflected in the reflective layer 40. Thus, the organic EL device 101 can suppress the occurrence of waveguided light, and thereby can achieve a higher light extraction efficiency than obtained in Comparative Example 1.

<Dependence of Reflectance on Incident Angle>

By simulation, the dependence of reflectance on incident angle was examined with respect to reflective layers 40 including base materials 43 with different refractive indexes.

Models used in the simulation will be described. Here, light having a wavelength of 533 nm was incident on a reflective layer 40 having a length of 30 mm, a width of 30 mm and a thickness of 1 mm at incident angles β (β: 0° to 80°), and thereby the reflectance of the reflective layer 40 was measured. The wavelength of 533 nm corresponds to the peak wavelength of light emitted from an $Alq_3$ layer as the electroluminescent layer 32. The incident angle β means an angle formed by the normal direction to the principal surface of the reflective layer 40 and the incident direction in which light is incident from a medium on the reflective layer 40.

The simulation conditions were as follows.
Simulation technique: ray-tracing method
Simulation software: illumination design software Light-Tools, which is provided by Synopsys, Inc.
Parameters:
  Refractive index of base material 43 in Example 1: 1.772
  Refractive index of base material 143 in Comparative Example 1: 1.6
  Refractive index of incident-side medium (e.g., $Alq_3$): 1.768
  Volume ratio of fillers 44 to base material 43: 20%
  Diameter of fillers 44 (e.g., spheres): 0.7 μm
  Refractive index of fillers 44: 1.4

Figure 8:
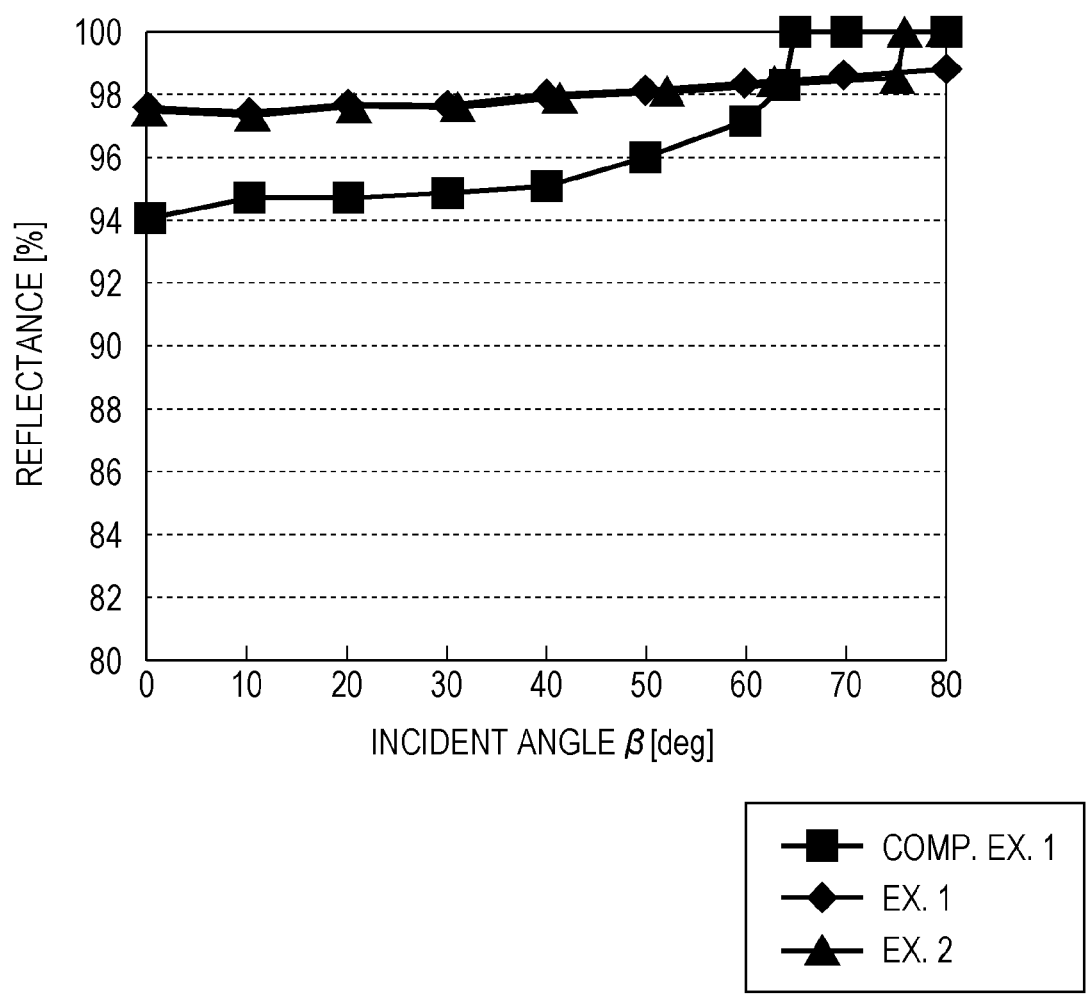
FIG. 8 is a diagram illustrating an example of the dependence of the reflectance of reflective layers on incident angle.

The simulation results are shown in FIG. 8. In Comparative Example 1, total reflection occurred when the incident angle β was 65° and above. In contrast, no total reflection occurred in Example 1 even at a larger incident angle β. This result is ascribed to the fact that the refractive index of the base material 43 in Example 1 is higher than that of the incident-side medium. In addition, the comparison of reflectance values at incident angles β of 0° to less than 65° shows that the reflectance obtained in Example 1 was higher than the reflectance obtained in Comparative Example 1. That is, the reflective layer 40 of Example 1 had a higher reflectance than the reflective layer 140 of Comparative Example 1. This result is probably ascribed to the fact that the difference in refractive index between the base material 43 and the fillers 44 in the reflective layer 40 of Example 1 was larger than the difference in refractive index between the base material 143 and the fillers 44 in the reflective layer 140 of Comparative Example 1.

By virtue of the base material 43 of the reflective layer 40 having a high refractive index, the organic EL device 101 can prevent the light from the electroluminescent layer 32 from being totally reflected by the surface of the reflective layer 40. Consequently, the organic EL device 101 can suppress a decrease in light extraction efficiency due to the generation of waveguided light. In the organic EL device 101, the light enters into the reflective layer 40 without being totally reflected and then is diffusely reflected inside the reflective layer 40. In this case, the greater the difference in refractive index between the fillers 44 and the base material 43 is, the higher reflectance the reflective layer 40 has, thereby enabling light to be extracted more efficiently.

Example 2 and Comparative Example 2

Hereinbelow, a specific example of the organic EL devices of Second Embodiment will be described as Example 2 with reference to the drawings.

Figure 6:
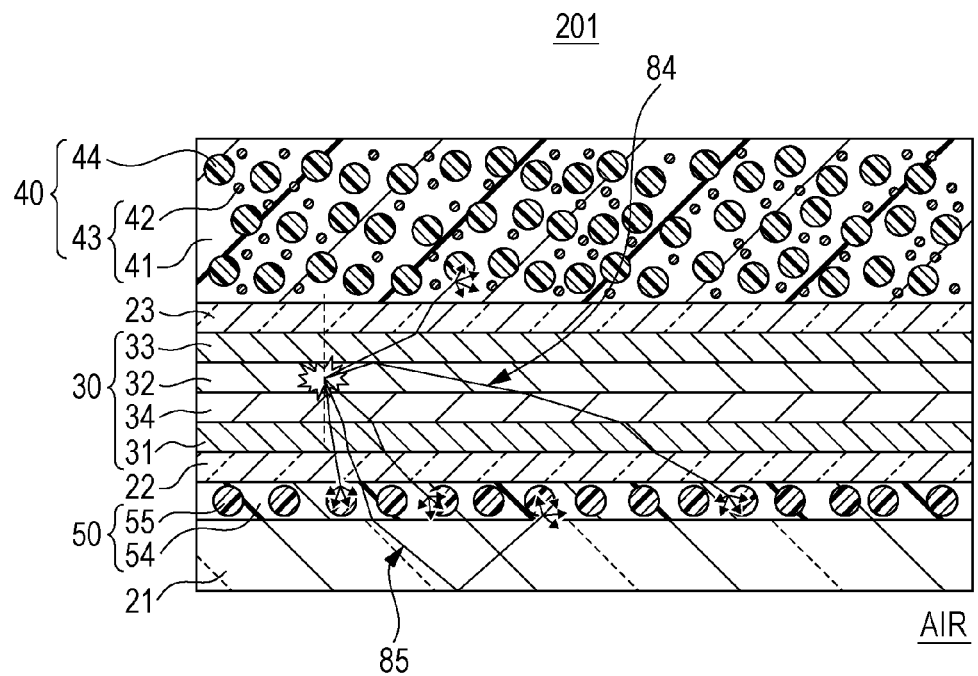
FIG. 6 is a schematic sectional view of an organic EL device of Example 2.
Figure 7:
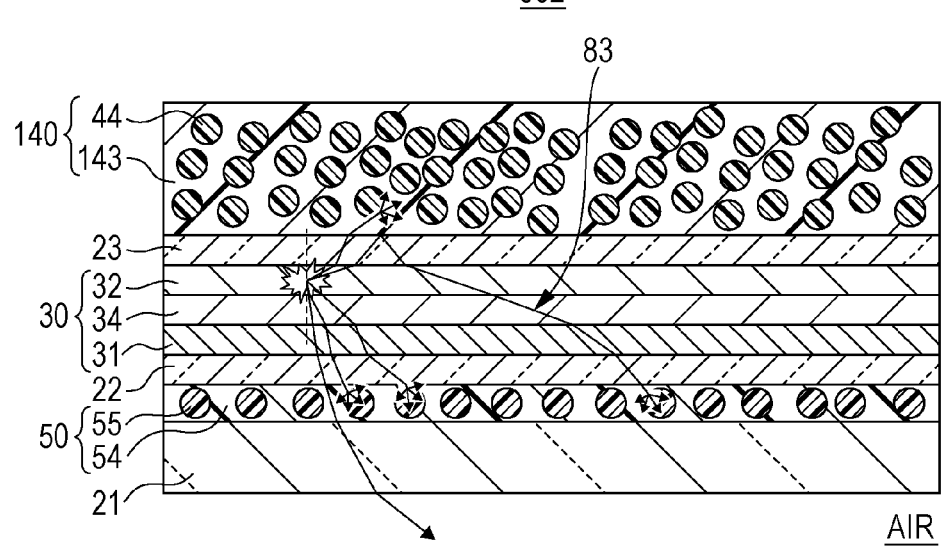
FIG. 7 is a schematic sectional view of an organic EL device of Comparative Example 2.

FIG. 6 is a schematic sectional view illustrating an organic EL device 201 of Example 2. FIG. 7 is a schematic sectional view illustrating an organic EL device 502 of Comparative Example 2. The refractive indexes and the extinction coefficients of the materials for the layers used in Example 2 and Comparative Example 2 are described in Table 1.

Example 2

As illustrated in FIG. 6, the organic EL device 201 of Example 2 has a low-reflectance layer 33 having a refractive index that is 95% or more of the refractive index of the electroluminescent layer 32. Further, the organic EL device 201 includes a light extraction layer 50 between the substrate 21 and the first electrode layer 22. In Example 2, the low-reflectance layer 33 is a TAZ layer having a refractive index that is 97% of the refractive index of the electroluminescent layer 32. The light extraction layer 50 is composed of an imide resin 54 and silicone resin particles 55 dispersed in the imide resin 54. For example, the light extraction layer 50 may be formed by the method described in Specific Example 1. The other configurations are the same as in Example 1.

Comparative Example 2

As illustrated in FIG. 7, the organic EL device 502 of Comparative Example 2 includes a light extraction layer 50 between the substrate 21 and the first electrode layer 22. The organic EL device 502 does not have a low-reflectance layer. The light extraction layer 50 is composed of an imide resin 54 and silicone resin particles 55 dispersed in the imide resin 54. The other configurations are the same as in Comparative Example 1.

<Behavior of Light Emitted from Electroluminescent Layer>

FIGS. 6 and 7 illustrate the behaviors of light emitted from the electroluminescent layer 32 in Example 2 and Comparative Example 2, respectively.

In Comparative Example 2, as illustrated in FIG. 7, light 83 emitted from the electroluminescent layer 32 enters into the second electrode layer 23 at a high angle and then passes through the second electrode layer 23. The second electrode layer 23 is an ITO film formed at room temperature, which has high light-absorbing properties. Thus, part of the light 83 is absorbed by the ITO film.

In Example 2, in contrast, as illustrated in FIG. 6, light 84 that is incident from the electroluminescent layer 32 onto the low-reflectance layer 33 at a high angle is totally reflected by the interface between the electroluminescent layer 32 and the low-reflectance layer 33. Consequently, the low-reflectance layer 33 can decrease the amount of light absorbed by the second electrode layer 23. The totally reflected light 84 enters into the light extraction layer 50 and then is scattered in the light extraction layer 50. As a result, when the light 84 is incident from the glass substrate 21 onto the air at an incident angle that is less than the critical angle, the light 84 is extracted out of the device to the air. Even when the incident angle of the light 84 incident from the glass substrate 21 onto the air is equal to or greater than the critical angle, the light 84 is totally reflected by the interface between the substrate 21 and the air, is scattered in the light extraction layer 50 again, and then may be extracted out of the device to the air. Accordingly, the organic EL device 201 of Example 2 can achieve a higher light extraction efficiency than obtained with the organic EL device 502 of Comparative Example 2.

<Dependence of Reflectance on Incident Angle>

By the same simulation method as in Example 1, the dependence of light reflectance on incident angle was examined with respect to the reflective layer 40 of Example 2. In the simulation, light was incident on the reflective layer 40 through the low-reflectance layer 33. The refractive index of the low-reflectance layer 33 was 1.718. The other parameters were the same as in Example 1. Although the simulation model did not contain the second electrode layer 23, the results obtained by the simulation substantially describe the reflective characteristics in Example 2 because all the light that has entered into the low-reflectance layer 33 in Example 2 will reach the reflective layer 40 without being reflected by the second electrode layer 23.

The simulation results are illustrated in FIG. 8. The incident angle β in Example 2 shown in FIG. 8 is the incident angle of light incident from the incident-side medium onto the low-reflectance layer 33. In Example 2, total reflection occurred when the incident angle β was 76° and above. On the other hand, the reflectance at an incident angle β of less than 76° in Example 2 was substantially equal to the reflectance in Example 1.

As a result of the organic EL device 201 having the low-reflectance layer 33, light that is incident from the electroluminescent layer 32 onto the low-reflectance layer 33 at a low angle may be reflected by the reflective layer 40 while light that is incident from the electroluminescent layer 32 onto the low-reflectance layer 33 at a high angle may be reflected by the surface of the low-reflectance layer 33. In the organic EL device 201, light incident on the low-reflectance layer 33 at a high angle is not allowed to enter into the second electrode layer 23, and consequently the amount of light absorbed by the second electrode layer 23 can be reduced.

<Analysis of Difference in Refractive Index Between Base Material 43 and Fillers 44>

By simulation, the relationship between the difference in refractive index between the base material 43 and the fillers 44, and the reflectance of the reflective layer 40 were examined.

Models used in the simulation will be described. Light having a wavelength of 533 nm was incident on a reflective layer 40 having a length of 30 mm, a width of 30 mm and a thickness of 1 mm, in the direction of the normal to the reflective layer 40 (incident angle β: 0°), and thereby the reflectance of the reflective layer 40 was measured.

The simulation conditions were as follows.
Simulation technique: ray-tracing method
Simulation software: illumination design software LightTools, which is provided by Synopsys, Inc.
Parameters:
  Refractive index of base material 43: 1.8
  Refractive index of incident-side medium: 1.0
  Volume ratio of fillers 44 to base material 43: 60%
  Diameters of fillers 44 (e.g., spheres): 0.1 μm, 0.7 μm, 2 μm
  Refractive indexes of fillers 44: 1.0 to 2.5

Figure 9:
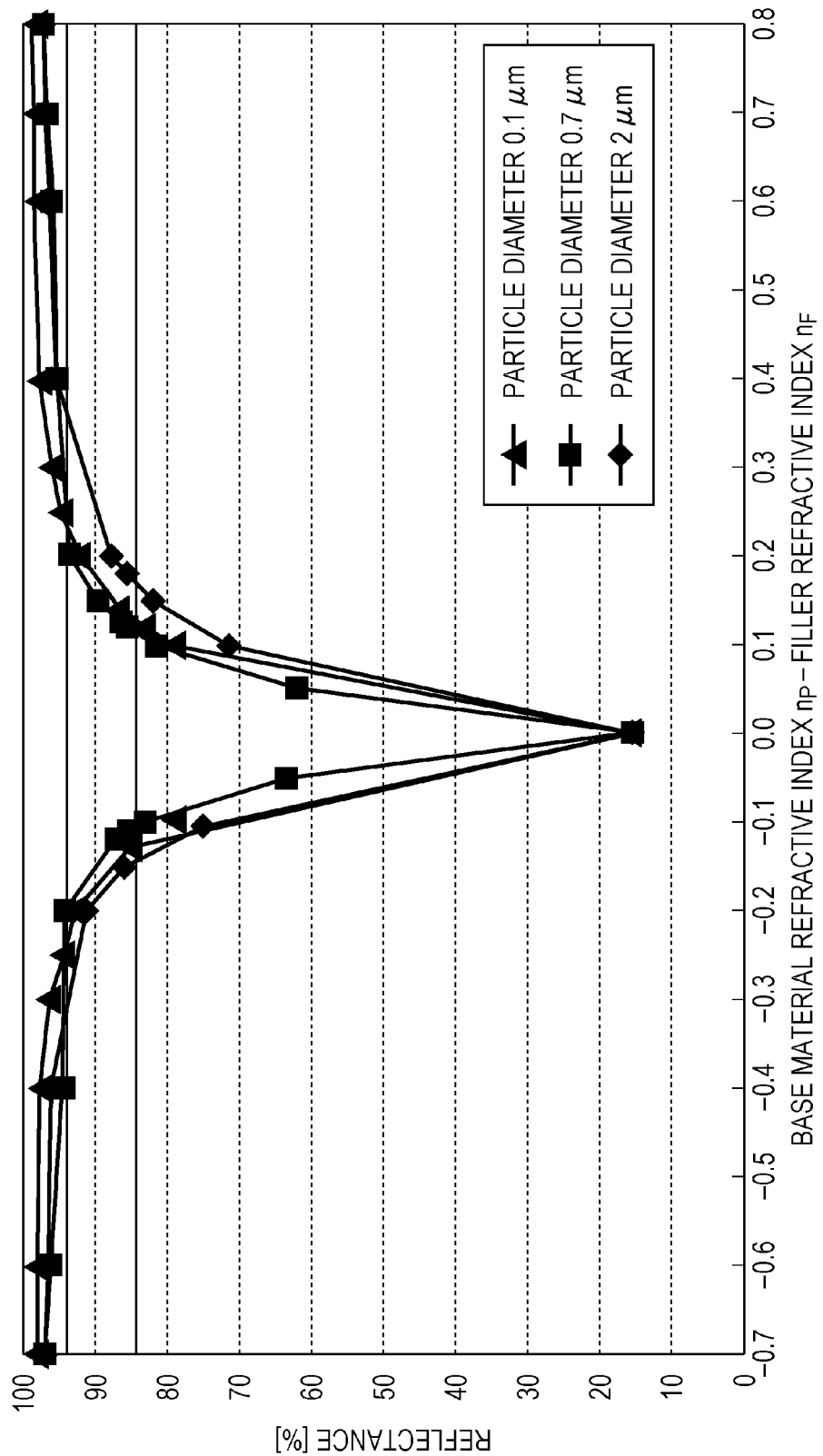
FIG. 9 is a diagram illustrating an example of the relationship between the difference in refractive index between a base material and fillers, and the reflectance.

The simulation results are illustrated in FIG. 9. As illustrated in FIG. 9, the reflectance exceeded 85%, which is equal to the reflectance of aluminum, when the absolute value of the difference in refractive index between the fillers 44 and the base material 43 was 0.11 and above. The reflectance surpassed 95%, which is equal to the reflectance of silver, when the absolute value of the difference in refractive index was 0.25 and above.

<Relationship Between Fillers/Base Material Volume Ratio and Reflectance>

The relationship between the volume ratio of the fillers 44 to the base material 43 and the reflectance was studied by conducting simulation under the same conditions as the above, except that the refractive index of the fillers 44 was 1.69, namely, the difference from the refractive index of the base material 43 was 0.11, the diameter of the fillers 44 was 0.7 μm, and the volume ratio of the fillers 44 to the base material 43 was varied.

As a result, it has been found that a high reflectance of 60% or more may be obtained when the volume ratio of the fillers 44 to the base material 43 is 10% or above. Thus, a desired reflectance may be realized by controlling the volume ratio of the fillers 44 to the base material 43, although variable depending on factors such as the diameter and the refractive index of the fillers 44.

Third Embodiment

Light extraction efficiency may be decreased when part of light that has entered into a reflective layer is absorbed by the reflective layer. For example, light that has entered into the reflective layer at a high angle may be absorbed more by the reflective layer than light that has entered thereinto at a low angle, resulting from a difference in the distance at which the light passes through the reflective layer.

The present inventors focused on this fact, and thus studied structures that would make it possible to decrease the amount of light absorbed by a reflective layer. As a result, the present inventors have arrived at an organic EL device that includes a low-refractive index layer disposed between a reflective layer and an electroluminescent layer, and a light extraction layer. The low-refractive index layer, which has a lower refractive index than the electroluminescent layer, is configured to totally reflect light incident thereon at a high angle. The light extraction layer is configured to scatter the totally reflected light. With this configuration, light extraction efficiency can be enhanced.

The "low-reflectance layers" and the "low-refractive index layers" described in Second Embodiment may be included in examples of the "low-refractive index layers" of the present embodiment. For example, low-refractive index layers having a refractive index that is 95% to less than 100% of the refractive index of the electroluminescent layer may be sometimes referred to as low-reflectance layers. Thus, the organic EL device 300 illustrated in FIG. 3 also represents a specific example of Third Embodiment. In the following, other examples will be described.

Figure 10:
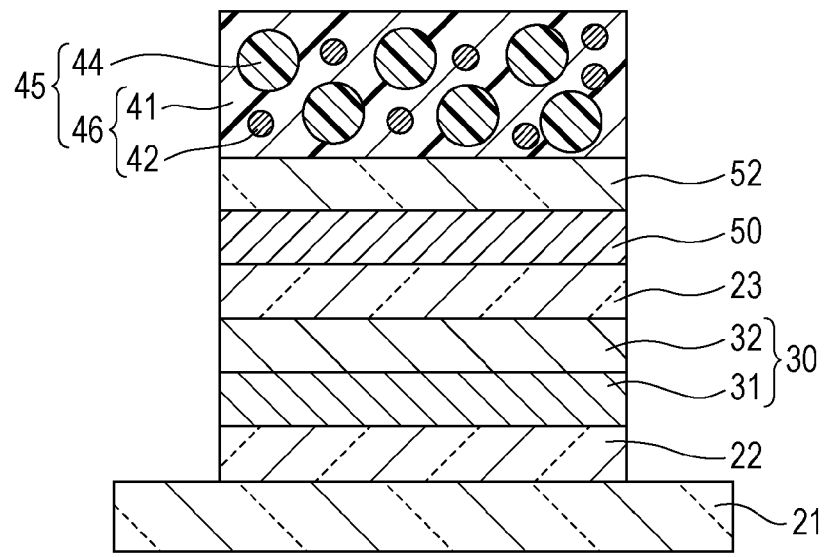
FIG. 10 is a sectional view schematically illustrating an example of organic EL devices in Third Embodiment.

FIG. 10 is a schematic sectional view illustrating an example of the organic EL devices in Third Embodiment. An organic EL device 102 illustrated in FIG. 10 includes a substrate 21, a first electrode layer 22, a second electrode layer 23, an organic layer 30 as a functional layer, and a reflective layer 45. In this example, the organic layer 30 includes an electroluminescent layer 32 and a hole injection layer 31.

The reflective layer 45 is disposed on the side of the second electrode layer 23 opposite to the organic layer 30. The reflective layer 45 may be any layer capable of diffusely reflecting light emitted from the electroluminescent layer 32, and the material and the structure thereof are not particularly limited. In the example illustrated in FIG. 10, the reflective layer 45 includes a base material 46 and fillers 44. The reflective layer 45 may have a structure similar to that of the reflective layer 40 described with reference to FIG. 1.

Similarly to the organic EL device 300 described with reference to FIG. 3, the organic EL device 102 has a low-refractive index layer 52 and a light extraction layer 50. In the example illustrated in FIG. 10, the low-refractive index layer 52 is disposed between the second electrode layer 23 and the reflective layer 45. However, the position of the low-refractive index layer 52 is not limited thereto. The low-refractive index layer 52 may be disposed anywhere between the electroluminescent layer 32 and the reflective layer 45. This configuration enables light emitted from the electroluminescent layer 32 toward the reflective layer 45 to be extracted from the light extraction side, thus enhancing the light extraction efficiency. The organic EL device 102 has at least one low-refractive index layer 52 and may have a plurality of low-refractive index layers 52.

The low-refractive index layer 52 has light transmissivity. In the example illustrated in FIG. 10, part of light incident from the light extraction layer 50 onto the low-refractive index layer 52 passes through the low-refractive index layer 52 and then enters into the reflective layer 45. Other part of the light incident from the light extraction layer 50 onto the low-refractive index layer 52 is totally reflected by the interface between the low-refractive index layer 52 and the light extraction layer 50.

The light extraction layer 50 may be any layer which can disorder the reflection angle and/or the refraction angle of light. The light extraction layer 50 may be disposed anywhere between the substrate 21 and the low-refractive index layer 52. In the example illustrated in FIG. 10, the light extraction layer 50 is disposed between the second electrode layer 23 and the low-refractive index layer 52. The organic EL device 102 has at least one light extraction layer 50 and may have a plurality of light extraction layers 50.

By virtue of the above configuration, the organic EL device 102 can achieve the following effects.

In a conventional organic EL device, light is absorbed in a reflective layer and consequently light extraction efficiency may be decreased. In particular, light that has entered into a reflective layer at a high angle may propagate a longer distance in the reflective layer than light that has entered at a low angle. Thus, as shown by the equation (2) described hereinabove, entry into a reflective layer at a high angle leads to a large amount of light absorbed by the reflective layer. That is, an increase in the amount of light entering into a reflective layer at a high angle may result in a decrease in light extraction efficiency.

In a conventional organic EL device, further, part of light emitted on the electroluminescent layer may be totally reflected by any of the interfaces present in the device and then propagate as waveguided light inside the device at times. In this case, the waveguided light may not be extracted out of the device. For example, when the waveguided light passes through an organic layer and/or an electrode layer repeatedly, part of the light may be absorbed by these layers.

In contrast, the organic EL device 102 is such that at least part of light incident from the light extraction layer 50 onto the low-refractive index layer 52 at a high angle is totally reflected by the interface between these layers, and thus is prevented from entry into the reflective layer 45. Consequently, the amount of light absorbed by the reflective layer 45 can be decreased. The totally reflected light is scattered by the light extraction layer 50 and thereby can be extracted out of the organic EL device 102 without propagating as waveguided light. In this manner, the light extraction efficiency can be enhanced. Light incident from the light extraction layer 50 onto the low-refractive index layer 52 at a low angle passes through the low-refractive index layer 52, enters into the reflective layer 45, and then is diffusely reflected therein. As a result, the light may be extracted out of the organic EL device 102 through the substrate 21 side.

The light incident on the low-refractive index layer 52 at a high angle is totally reflected by the low-refractive index layer 52 without entering thereinto. Thus, the absorption of light by the low-refractive index layer 52 can be reduced and therefore a decrease in light extraction efficiency can be prevented even when, in particular, the low-refractive index layer 52 has a high extinction coefficient or a large thickness (for example, 1 μm to 1 mm).

[Elements Constituting Organic EL Device 102]

The materials and the configurations of the substrate 21, the first electrode layer 22, the second electrode layer 23 and the organic layer 30 in the organic EL device 102 may be the same as those in First or Second Embodiment.

(Reflective Layer 45)

For example, the reflective layer 45 may be a diffuse reflection layer. The diffuse reflection layer may be any layer capable of diffusely reflecting light emitted from the electroluminescent layer 32. In this case, the reflective layer 45 can diffusely reflect light without strong interference due to specular reflection, thereby allowing the organic EL device to be thinned easily. As another example, the reflective layer 45 may be a metal film. Examples of the metal films include an aluminum film, a chromium film and a silver film. The metal film may be formed by any method such as deposition or sputtering. Alternatively, the reflective layer 45 may be a reflective film that is composed of a matrix coated with reflective particles, or may be a multilayer film of such materials as dielectric materials.

The surface of the reflective layer 45 on the second electrode layer 23 side may have light-scattering properties. The structure that gives light-scattering properties is not particularly limited.

For example, the surface of the reflective layer 45 on the second electrode layer 23 side may have irregularities. For example, the irregularities may be formed by the same method as the irregularities formed in the light extraction layer 50.

For example, the reflective layer 45 may include a reflective film and a light scattering layer disposed on the second electrode layer 23 side of the reflective film. The light scattering layer may include a base material and particles dispersed in the base material, both of which have different refractive indexes from each other. Such a base material and particles may be a product obtained by a sol-gel method. The light scattering layer may include a large number of voids inside the layer. The light scattering layer may contain a plurality of materials in separate phases.

For example, the reflective layer 45 may include a reflective film and a plurality of fine particles arranged or scattered on the surface of the reflective film. With this configuration, light-scattering properties or diffraction properties may be imparted to the surface of the reflective layer 45.

For example, the reflective layer 45 has a reflectance of 60% or more, and desirably 80% or more. The reflective layer 45 may have flexibility.

(Specific Example of Reflective Layer 45)

As illustrated in FIG. 10 as an example, the reflective layer 45 may include a base material 46 and fillers 44 having a different refractive index from the base material 46. In other words, the reflective layer 45 illustrated in FIG. 10 is a diffuse reflection layer having high reflectance. Similarly to the reflective layer 40 described as an example in First Embodiment, the reflective layer 45 may have a higher reflectance than reflective layers made of metal materials. For example, the reflective layer 45 may have a reflectance equal to or higher than 95%, which is equal to the highest reflectance of metals, namely, the reflectance of silver, although variable depending on factors such as the difference in refractive index between the base material 46 and the fillers 44, and the light incident angle.

The base material 46 may be composed of more than one material. For example, the base material 46 may include a matrix 41 and auxiliary fillers 42 dispersed in the matrix 41, and the auxiliary fillers 42 has a higher refractive index than the matrix 41. The refractive index of the base material 46 may be controlled by controlling, for example, the volume ratio of the auxiliary fillers 42 to the base material 46. In this case, the control allows the difference in refractive index between the base material 46 and the fillers 44 to be increased, thereby enabling the reflectance of the reflective layer 45 to be increased. As a result, the light extraction efficiency can be enhanced.

The base material 46 may have a refractive index equal to or higher than the refractive index of the low-refractive index layer 52. In this case, light incident from the low-refractive index layer 52 on the reflective layer 45 enters into the reflective layer 45 without being totally reflected by the interface between the reflective layer 45 and the low-refractive index layer 52. The light that has entered into the reflective layer 45 is diffusely reflected by the interfaces between the base material 46 and the fillers 44. In this case, the base material 46, since having a refractive index equal to or higher than that of the low-refractive index layer 52, can reduce the occurrence of waveguided light. This can enhance the light extraction efficiency. Further, the suppression of total reflection may suppress fluctuations in emission spectra ascribed to the interference of totally reflected light.

The reflective layer 45 including the base material 46 and the fillers 44 can prevent generation of surface plasmon thereon, thus allowing a loss associated therewith to be prevented. Further, the reflective layer 45 including the base material 46 and the fillers 44 exhibits smaller dependences of reflectance on wavelength and incident angle as compared to when the reflective layer 45 is a dielectric multilayer film. Consequently, the light extraction efficiency can be enhanced more reliably.

For example, the reflective layer 45 in the organic EL device 102 may be formed by the same method as the reflective layer 40 described in First Embodiment. Examples of the materials of the matrix 41, the auxiliary fillers 42 and the fillers 44 in the reflective layer 45 include the same materials as those in the reflective layer 40. The refractive index $n_F$ of the fillers 44 may be different from the refractive index $n_P$ of the base material 46.

The base material 46 may be composed of a single material. In the case where, for example, the low-refractive index layer 52 is an air layer, examples of the materials of the base material 46 include resin compounds such as acrylic compounds, epoxy compounds, silicone compounds and fluorine-containing compounds. Examples of the materials of the base material 46 further include sulfur-modified resin compounds such as thiophene resin compounds. The base material 46 including any of these materials may exhibit a refractive index that is equal to or higher than that of the electroluminescent layer 32.

(Low-refractive Index Layer 52)

The configuration of the low-refractive index layer 52 may be the same as that of the low-refractive index layer 52 described with reference to FIG. 3 in Second Embodiment. However, the refractive index of the low-refractive index layer 52 is not limited to less than 95% of the refractive index of the electroluminescent layer 32 as long as the refractive index of the low-refractive index layer 52 is lower than the refractive index of the electroluminescent layer 32.

The lower the refractive index of the low-refractive index layer 52, the lower the critical angle for the light incident on the low-refractive index layer 52. Thus, the total reflection of light incident on the low-refractive index layer 52 can occur at a wider range of incident angles with decreasing refractive index of the low-refractive index layer 52. For example, the refractive index of the low-refractive index layer 52 may be less than 1.5. In the case where the low-refractive index layer 52 is an air layer, the refractive index is low (e.g., 1.0) and therefore the critical angle is small. For example, the critical angle, which is determined by the relationship between the refractive index of the electroluminescent layer 32 and the refractive index of the low-refractive index layer 52, may be 34° to 65°.

When, for example, the refractive index of the base material 46 in the reflective layer 45 is less than the refractive index of the low-refractive index layer 52, light may be totally reflected by the surface of the reflective layer 45. In this case, the totally reflected light may cause strong interference in the organic EL device 102 and consequently fluctuations may occur in emission spectra depending on the variation of the thicknesses of the layers in the organic layer 30. In view of this, the thickness of the low-refractive index layer 52 may be, for example, 1 μm or more. With this configuration, since the distance between the reflective layer 45 and the electroluminescent layer 32 is large enough not to cause optical interference, the robustness to the variation of the thicknesses of the layers can be enhanced.

When, for example, the refractive index of the base material 46 in the reflective layer 45 is equal to or higher than the refractive index of the low-refractive index layer 52, light may be reflected at the interface between the low-refractive index layer 52 and the high-refractive index reflective layer 45 due to the different refractive indexes. In this case, the interference by the reflected light may be suppressed when the thickness of the low-refractive index layer 52 is 1 μm or more.

The thickness of the low-refractive index layer 52 may be equal to or larger than the wavelength of visible light possibly emitted from the electroluminescent layer 32, for example, 1 μm or more. With this configuration, the leakage of evanescent light during the total reflection of visible light can be prevented, and thereby the light extraction efficiency can be further enhanced.

The thickness of the low-refractive index layer 52 may be 1 mm or less. With this configuration, the absorption of light by the low-refractive index layer 52 can be reduced even when, for example, the low-refractive index layer 52 has a high extinction coefficient.

(Light Extraction Layer 50)

The configuration of the light extraction layer 50 in the organic EL device 102 may be the same as that of the light extraction layer 50 described with reference to FIGS. 2 and 3 in Second Embodiment. The structure of the light extraction layer 50 is not limited to any particular structure as long as the structure of the light extraction layer 50 can disorder the reflection angle and/or the refraction angle of light that has entered into the light extraction layer 50.

The light extraction layer 50 may be disposed anywhere between the substrate 21 and the low-refractive index layer 52.

As illustrated in FIG. 10, the low-refractive index layer 52 may be disposed between the second electrode layer 23 and the reflective layer 45, and the light extraction layer 50 may be disposed between the second electrode layer 23 and the low-refractive index layer 52. In this case, for example, the light extraction layer 50 may be formed after the formation of the first electrode layer 22, the organic layer 30 and the second electrode layer 23. In this manner, since the structure of the light extraction layer 50 does not affect that of the previously formed layers, the light extraction layer 50, even if having any irregularities, does not cause leak current in the layers relating to electroluminescence. Thus, freedom in selecting the structure and the material of the light extraction layer 50 can be improved. Further, the refractive indexes of the first electrode layer 22, the organic layer 30 and the second electrode layer 23 can be freely designed without consideration of the occurrence of total reflection in these layers, since these layers are not placed between the light extraction layer 50 and the low-refractive index layer 52. The light extraction layer 50 may be in contact with the low-refractive index layer 52. The low-refractive index layer 52 may have irregularities on the surface in contact with the light extraction layer 50. With this configuration, light may be diffused more efficiently at the interface between the low-refractive index layer 52 and the light extraction layer 50 and consequently the light extraction efficiency may be enhanced.

Alternatively, for example, the light extraction layer 50 may be disposed between the substrate 21 and the first electrode layer 22. For example, the light extraction layer 50 may be formed on the substrate 21 before the formation of the first electrode layer 22, the organic layer 30 and the second electrode layer 23. In this case, the light extraction layer 50 may be formed with few limitations on the process. For example, the light extraction layer 50 may be formed at a relatively high temperature. The top surface of the light extraction layer 50 may be substantially flat. This enables the formation of leak current paths in the device to be suppressed, even if the first electrode layer 22, the organic layer 30 and the second electrode layer 23 are formed in a shape which reflects the surface shape of the light extraction layer 50.

The refractive index of the layer(s) between the low-refractive index layer 52 and the light extraction layer 50 may be equal to or higher than the refractive index of the electroluminescent layer 32. With this configuration, light totally reflected by the lower surface of the low-refractive index layer 52 may reach the light extraction layer 50 without being totally reflected by the interlayer(s) and consequently the occurrence of waveguided light may be suppressed. For example, the refractive index of the hole injection layer 31 may be equal to or higher than the refractive index of the electroluminescent layer. This configuration can suppress the occurrence of waveguided light between the lower surface of the low-refractive index layer 52 and the interface between the hole injection layer 31 and the electroluminescent layer 32. For example, the refractive index of the first electrode layer 22 may be equal to or higher than the refractive index of the electroluminescent layer 32. This configuration can suppress the occurrence of waveguided light between the lower surface of the low-refractive index layer 52 and the interface between the first electrode layer 22 and the organic layer 30. For example, the refractive index of the second electrode layer 23 may be equal to or higher than the refractive index of the electroluminescent layer 32. This configuration may eliminate the occurrence of total reflection of the light at the interface of the second electrode layer 23 on the electroluminescent layer 32 side, thereby decreasing the amount of light confined in the device. Consequently, the light extraction efficiency can be enhanced.

Fourth Embodiment

Hereinbelow, organic EL devices of Fourth Embodiment will be described. The organic EL device of the present embodiment includes an air layer as a low-refractive index layer.

Figure 11:
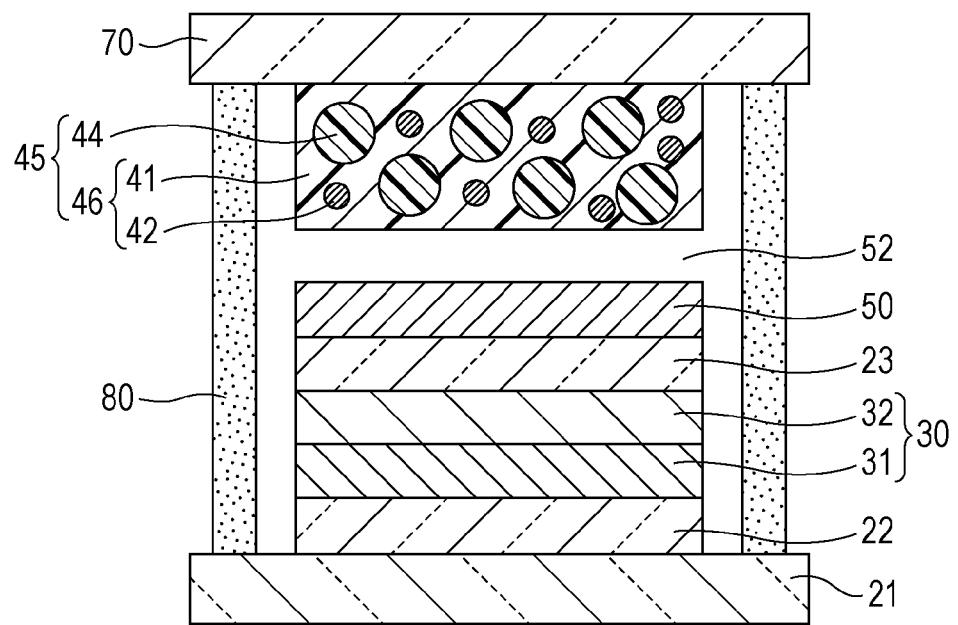
FIG. 11 is a sectional view schematically illustrating an example of organic EL devices in Fourth Embodiment.

FIG. 11 is a schematic sectional view illustrating an example of the organic EL devices in Fourth Embodiment.

An organic EL device 202 illustrated in FIG. 11 includes a sealing substrate 70 and a dam material 80. The sealing substrate 70 is disposed on the side of a reflective layer 45 opposite to an electroluminescent layer 32. The dam material 80 is bonding the sealing substrate 70 and a substrate 21 to each other. In the example illustrated in FIG. 11, the dam material 80 seals a stack including an organic layer 30. The reflective layer 45 is supported by the sealing substrate 70. An air gap is provided between the reflective layer 45 and a light extraction layer 50. The air gap is an example of a low-refractive index layer 52. The other configurations are the same as in the organic EL device 102 of Third Embodiment and thus the description thereof will be omitted.

The organic EL device 202 may achieve the same effects as the organic EL device 102. In the organic EL device 202, since the low-refractive index layer 52 is an air layer having low refractive index, the critical angle for light incident from the light extraction layer 50 onto the low-refractive index layer 52 can be further reduced. The critical angle, which is determined by the refractive index of the low-refractive index layer 52 and the refractive index of the electroluminescent layer 32, may be reduced to 50° or less, for example, to about 40°. Thus, the total reflection of light incident on the low-refractive index layer 52 can occur at a wider range of incident angles. Consequently, the amount of light that is allowed to enter into the low-refractive index layer 52 and the reflective layer 45 can be decreased, and thus the absorption of light by these layers can be reduced.

The position of the low-refractive index layer 52 is not limited to between the reflective layer 45 and the light extraction layer 50. The low-refractive index layer 52 may be provided anywhere between the electroluminescent layer 32 and the reflective layer 45. The position of the light extraction layer 50 is not limited to the one in the example shown in FIG. 11, and may be anywhere between the substrate 21 and the low-refractive index layer 52.

For example, the organic EL device 202 may be obtained as follows. First, at least one layer including the reflective layer 45 is formed on the sealing substrate 70, and a plurality of layers including the first electrode layer 22 and the electroluminescent layer 32 are formed on the substrate 21. Next, the sealing substrate 70 and the substrate 21 are arranged opposed to each other while an air gap is provided between the at least one layer formed on the sealing substrate 70 and the plurality of layers formed on the substrate 21. While keeping this state, the sealing substrate 70 and the substrate 21 are bonded to each other with the dam material 80.

[Elements Constituting Organic EL Device 202]

The materials and the configurations of the substrate 21, the first electrode layer 22, the second electrode layer 23, the organic layer 30 and the reflective layer 45 in the organic EL device 202 may be the same as those in Third Embodiment.

(Sealing Substrate 70)

Examples of the materials of the sealing substrate 70 include the same materials as those used for the substrate 21.

(Dam Material 80)

Examples of the materials of the dam material 80 include acrylic resins and epoxy resins. To ensure sealing properties, a low-vapor permeable material or a hygroscopic agent may be mixed with the dam material 80. When the low-refractive index layer 52 is an air layer, a desired thickness of the air layer (for example, 1 µm to 1 mm) may be obtained by controlling the height of the dam material 80. For example, the height of the dam material 80 may be controlled by adjusting the size of fillers added to the dam material 80. When, for example, a resin containing fillers with a diameter H is used to form the dam material 80, the height of the dam material 80 may be equal to the diameter H.

Various Examples

Examples 3 to 5

Hereinbelow, Examples of the organic EL devices of Third Embodiment will be described with reference to the drawings.

Figure 12:
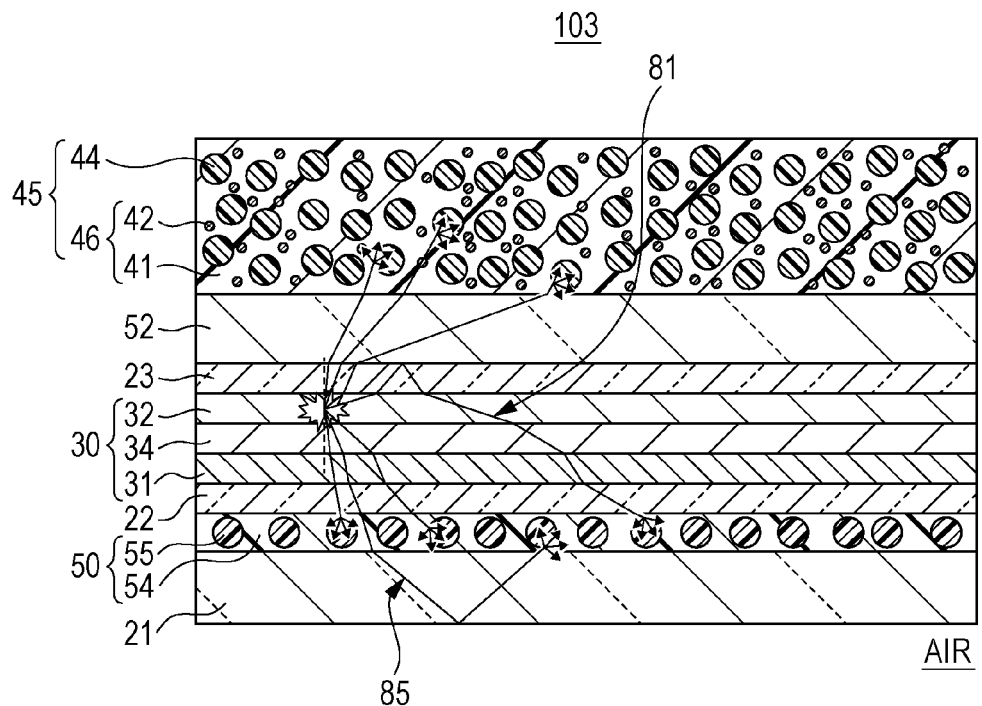
FIG. 12 is a schematic sectional view of an organic EL device of Example 3.
Figure 13:
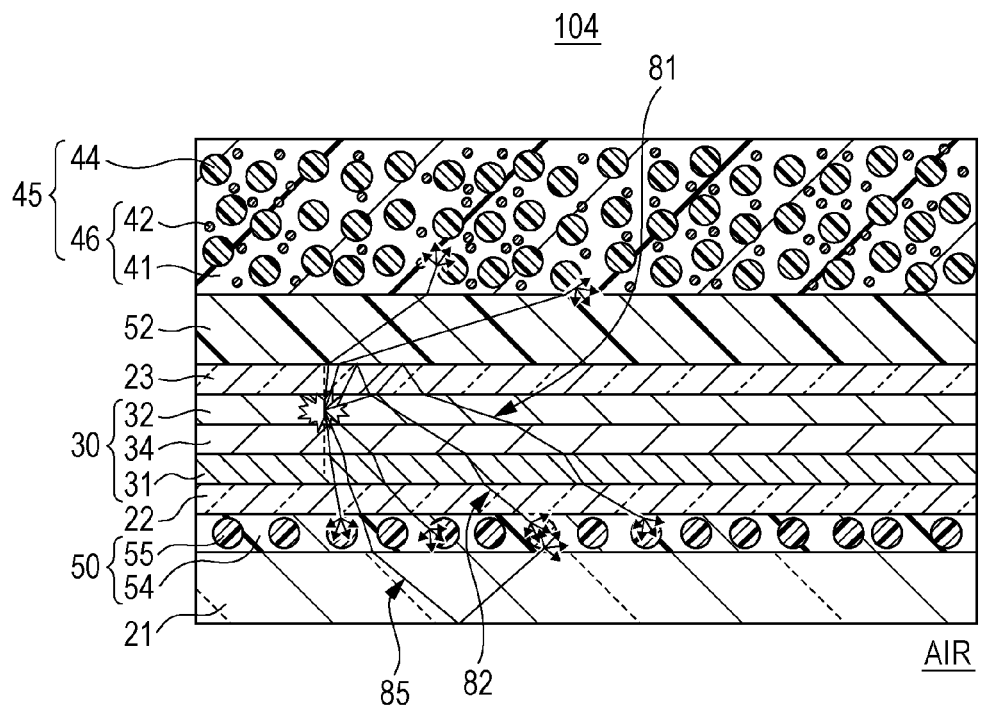
FIG. 13 is a schematic sectional view of an organic EL device of Example 4.
Figure 14:
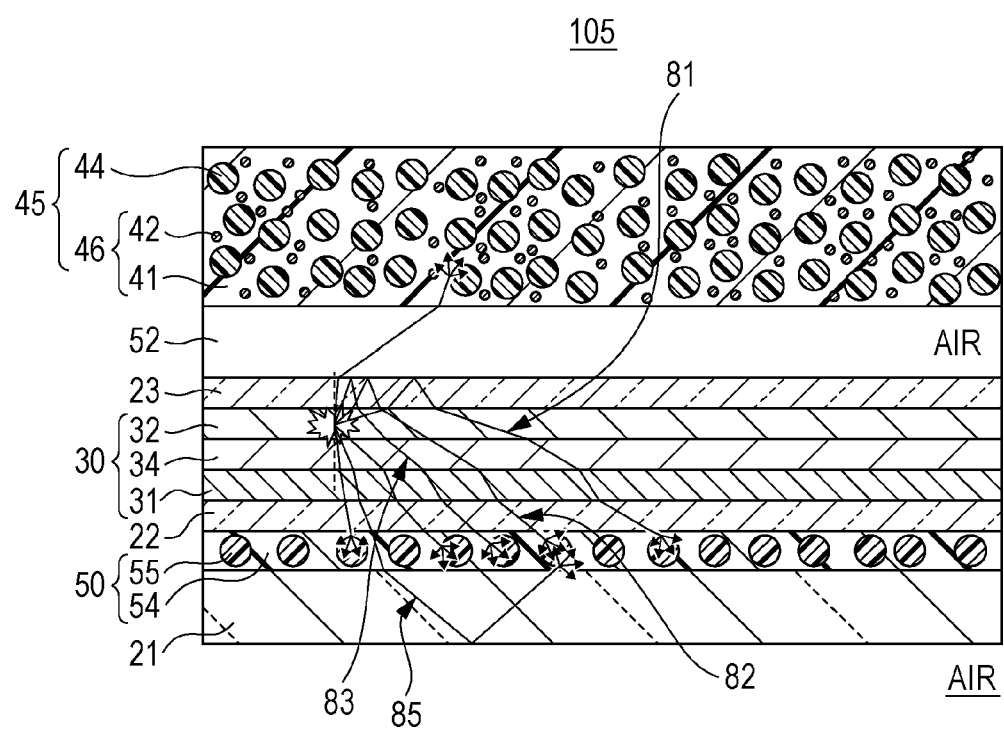
FIG. 14 is a schematic sectional view of an organic EL device of Example 5.

FIGS. 12 to 14 are schematic sectional views illustrating organic EL devices of Examples 3 to 5, respectively.

Table 2 describes the refractive indexes and the extinction coefficients of the materials for the layers used in Examples 3 to 5. The refractive indexes and the extinction coefficients shown in Table 2 are values with respect to 533 nm wavelength light, which corresponds to the peak wavelength of light emitted from an $Alq_3$ layer as the electroluminescent layer 32.

TABLE 2

| Materials | Refractive indexes | Extinction coefficients |
|---|---|---|
| Air | 1 | 0 |
| Glass | 1.52 | 0 |
| ITO film formed at 300° C. | 1.821 | 0.0059 |
| $MoO_3$ | 2.143 | 0.0136 |
| α-NPD | 1.794 | 0.0069 |
| $Alq_3$ | 1.768 | 0 |
| TAZ | 1.718 | 0 |
| ITO film formed at room temperature | 2.050 | 0.0304 |
| Acrylic resin | 1.6 | 0 |
| Acrylic resin + $ZrO_2$ particles | 1.772 | 0 |
| $ZrO_2$ particles | 2.1 | 0 |
| Silicone resin particles | 1.4 | 0 |
| Imide resin | 1.78 | 0 |
| Matching oil | 1.5 | 0 |
| Fluororesin | 1.34 | 0 |

Example 3

In the organic EL device of Example 3, as illustrated in FIG. 12, the substrate 21 is a glass substrate, the first electrode layer 22 is an ITO layer formed at 300° C., the hole injection layer 31 is a $MoO_3$ layer, the hole transport layer 34 is an α-NPD layer, the electroluminescent layer 32 is an $Alq_3$ layer, and the second electrode layer 23 is an ITO layer formed at room temperature. The reflective layer 45 is disposed on the second electrode layer 23 through a matching oil layer as the low-refractive index layer 52.

The light extraction layer 50 is composed of an imide resin 54 and silicone resin particles 55 dispersed in the imide resin 54. The light extraction layer 50 has the same structure as in Specific Example 1 described in Second Embodiment. The reflective layer 45 has the same structure as the reflective layer 40 in Example 1. The base material 46 has the same structure as the base material 43 in Example 1.

In Example 3, the refractive index of the electroluminescent layer 32 is 1.768, and the refractive index of the matching oil as the low-refractive index layer 52 is 1.5. From the refractive indexes of the electroluminescent layer 32 and the low-refractive index layer 52, the critical angle is determined to be 58°. Thus, light incident from the electroluminescent layer 32 onto the second electrode layer 23 at an angle of less than 58° passes through the second electrode layer 23 and the low-refractive index layer 52 and then enters into the reflective layer 45. The light that has entered into the reflective layer 45 is diffusely reflected in the reflective layer 45 and then may be extracted out of the organic EL device 103 from the substrate 21 side. On the other hand, light 81 incident from the electroluminescent layer 32 onto the second electrode layer 23 at a high angle of 58° or above enters into the second electrode layer 23 and then is totally reflected by the interface between the low-refractive index layer 52 and the second electrode layer 23. The totally reflected light enters into the light extraction layer 50 and then is scattered in the light extraction layer 50. Light incident from the substrate 21 onto the air at an incident angle of less than the critical angle is extracted out of the device into the air. When the incident angle of light incident from the substrate 21 onto the air is equal to or greater than the critical angle, the light is totally reflected by, for example, the interface between the substrate 21 and the air. The totally reflected light enters again into the light extraction layer 50 and then is scattered by the light extraction layer 50 similarly to, for example, light 85 illustrated in FIG. 12. The light repeatedly undergoes this process to attain an incident angle of less than the critical angle, and may be extracted out of the device into the air.

Example 4

In the organic EL device of Example 4 illustrated in FIG. 13, the low-refractive index layer 52 is a fluororesin layer (e.g., CYTOP manufactured by ASAHI GLASS CO., LTD.). The other configurations are the same as in Example 3.

In Example 4, the refractive index of the electroluminescent layer 32 is 1.768 and the refractive index of the fluororesin as the low-refractive index layer 52 is 1.34. From these refractive indexes, the critical angle is determined to be 49°. Thus, light incident from the electroluminescent layer 32 onto the second electrode layer 23 at an angle of less than 49° passes through the second electrode layer 23 and the low-refractive index layer 52 and then enters into the reflective layer 45, in which the light is diffusely reflected. On the other hand, light 81 and 82 incident from the electroluminescent layer 32 onto the second electrode layer 23 at an angle of 49° or above enters into the second electrode layer 23 and then is totally reflected by the interface between the low-refractive index layer 52 and the second electrode layer 23. The totally reflected light is scattered in the light extraction layer 50 and then may be extracted out of the device from the substrate 21 side.

In Example 4, even the light 82 incident from the electroluminescent layer 32 onto the second electrode layer 23 at an angle of 49° to less than 58° is totally reflected by the interface between the low-refractive index layer 52 and the second electrode layer 23. As a result, the light extraction efficiency can be enhanced as compared with that in Example 3.

Example 5

In the organic EL device of Example 5 illustrated in FIG. 14, the low-refractive index layer 52 is an air layer. The other configurations are the same as in Example 3.

In Example 5, the refractive index of the electroluminescent layer 32 is 1.768 and the refractive index of air is 1.0. From these refractive indexes, the critical angle is determined to be 34°. Thus, light incident from the electroluminescent layer 32 onto the second electrode layer 23 at an angle of less than 34° passes through the second electrode layer 23 and the low-refractive index layer 52 and then enters into the reflective layer 45, in which the light is diffusely reflected. On the other hand, light 81, 82 and 83 incident from the electroluminescent layer 32 onto the second electrode layer 23 at an angle of 34° or above enters into the second electrode layer and then is totally reflected by the interface between the low-refractive index layer 52 and the second electrode layer 23. The totally reflected light is scattered in the light extraction layer 50 and then may be extracted out of the device from the substrate 21 side.

In Example 5, even the light 83 incident from the electroluminescent layer 32 onto the second electrode layer 23 at an angle of 34° to less than 49° is totally reflected by the interface between the low-refractive index layer 52 and the second electrode layer. As a result, the light extraction efficiency can be enhanced as compared with that in Example 4.

<Dependence of Reflectance on Incident Angle>

By simulation, the dependence of reflectance on incident angle was examined with respect to low-refractive index layers 52 having different refractive indexes.

Here, light having a wavelength of 533 nm was incident on a reflective layer 45 having a length of 30 mm, a width of 30 mm and a thickness of 1 mm through a low-refractive index layer 52 at various incident angles β (β: 0° to 80°), and thereby the reflectance was measured. The incident-side medium was an $Alq_3$ layer. The wavelength of 533 nm corresponds to the peak wavelength of light emitted from an $Alq_3$ layer as the electroluminescent layer 32. The incident angle β means an angle formed by the normal direction to the principal surface of the low-refractive index layer 52 and the incident direction in which light is incident from the incident-side medium on the low-refractive index layer 52.

The simulation conditions are as follows.

Simulation technique: ray-tracing method

Simulation software: illumination design software Light-Tools, which is provided by Synopsys, Inc.

Parameters:
  Refractive index of base material 46 in reflective layer 45: 1.772
  Refractive index of incident-side medium (e.g., $Alq_3$): 1.768
  Volume ratio of fillers 44 to base material 46: 20%
  Diameter of fillers 44 (e.g., spheres): 0.7 μm
  Refractive index of fillers 44: 1.4
  Thickness of low-refractive index layer 52: 1 μm
  Refractive indexes of low-refractive index layer 52: 1.5 (Example 3), 1.34 (Example 4), 1.0 (Example 5)

Figure 15:
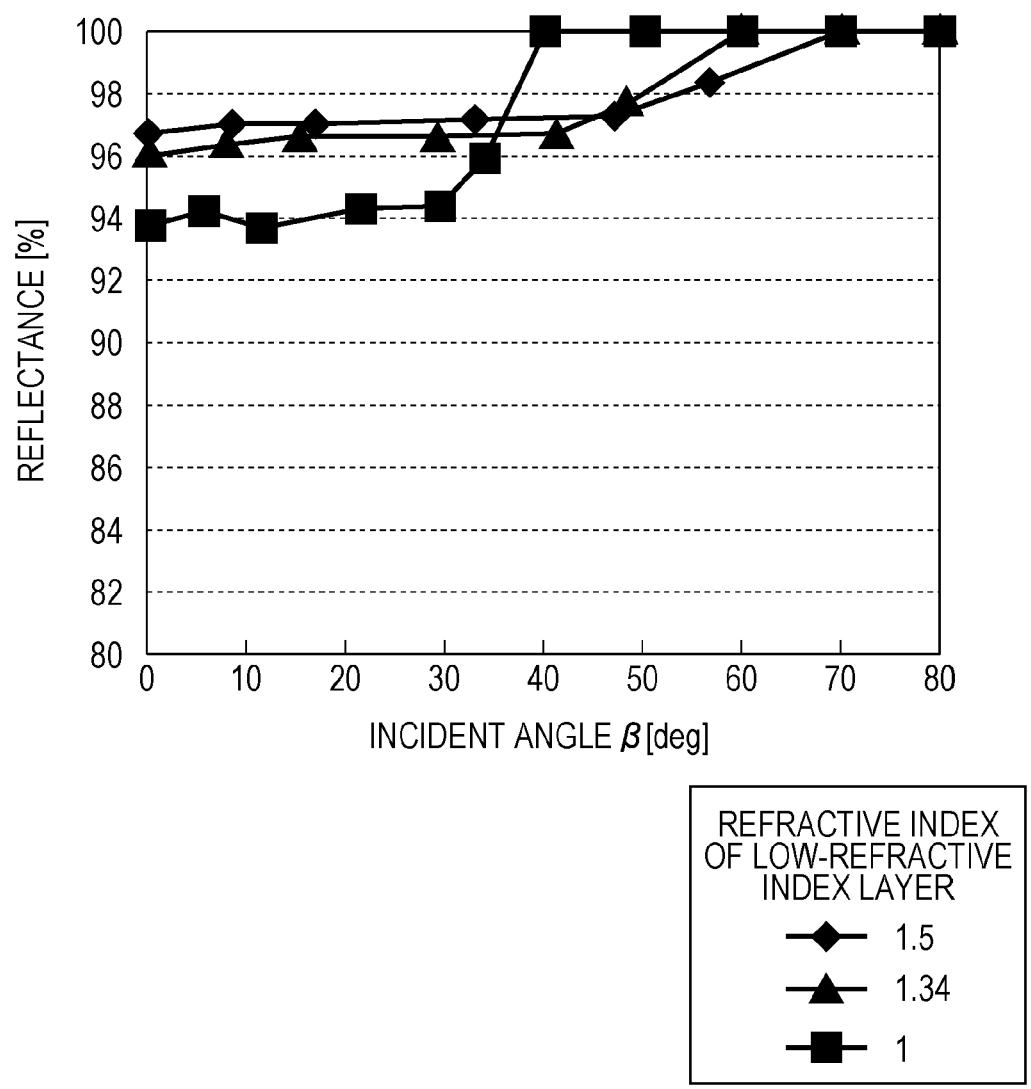
FIG. 15 is a diagram illustrating an example of the relationship between the refractive index of low-refractive index layers, and the dependence of reflectance on incident angle.

The simulation results are shown in FIG. 15. In Examples 3 to 5, as illustrated in FIG. 15, total reflection occurred when the incident angle β reached or exceeded the critical angle. At incident angles β below the critical angle, the reflectance of Example 5 was lower than the reflectances of Examples 3 and 4. This result is probably because the transmittance is decreased due to the difference in refractive index from the low-refractive index layer 52 by a greater extent as the refractive index of the low-refractive index layer 52 is smaller.

Modified Examples

The structures of the organic EL devices of the present disclosure are not limited to the structures illustrated as examples in the drawings. The features disclosed in the present disclosure such as the values, the shapes, the materials, the characteristics, the constituent elements, the positions and the manners in which the constituent elements are arranged and connected, the steps, and the order of the steps, are only illustrative and do not limit the scope of the present disclosure. Further, the attached drawings are schematic and are not necessarily to scale.

The reflective layers 40 and 45 in First to Fourth Embodiments may have conductive properties. For example, the base materials 43 and 46 may be formed of conductive materials. The reflective layers 40 and 45 may also serve as second electrode layers 23, in which case the organic EL devices having the reflective layer 40 or 45 may be free from the second electrode layer 23. The reflective layers 40 and 45 may be transparent electrode layers having irregularities on the surface. For example, the reflective layers 40 and 45 may be formed of a mixture of a base material with conductive particles having a size of 0.005 μm to 10 μm. Examples of the conductive particles include ITO particles, ZnO particles, Ag nanoparticles, Ag nanowires and Ag fillers. For example, fillers for imparting diffusive properties may be added to the base material in addition to the conductive particles whose sizes are 0.005 μm to 0.05 μm. In this case, for example, the size of the fillers may be 0.1 μm to 10 μm, and examples of the materials of the fillers include the same materials as those used for the fillers 44 in First Embodiment.

In the present disclosure, the phrase "fillers each having a refractive index different from a refractive index of the base material" includes not only all fillers having the same refractive index which is different from a refractive index of the base material, but also the fillers having different refractive indexes from one another as long as each of the refractive indexes is different from the refractive index of the base material. For example, the fillers may have some degree of dispersion in the refractive index, or may include plural kinds of fillers. The same applies to auxiliary fillers.

The technique of the present disclosure is not limited to organic EL devices and thus is applicable to a wide range of light-emitting devices. The term light-emitting device comprehends organic EL devices and inorganic EL devices. For example, the inorganic EL devices may include inorganic material layers such as zinc sulfide as electroluminescent layers.

The light-emitting devices of the present disclosure can have high light extraction efficiency and thus can realize high-efficiency optical devices. For example, the light-emitting devices of the present disclosure may be applied to a wide range of optical devices such as illumination lights, displays and projectors.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A light-emitting device comprising:
a first electrode layer having light transmissivity;
a second electrode layer opposed to the first electrode layer, the second electrode layer having light transmissivity;
an electroluminescent layer between the first electrode layer and the second electrode layer;
a reflective layer located on a side opposite to the electroluminescent layer with respect to the second electrode layer;
a low reflectance layer between the electroluminescent layer and the reflective layer, the low reflectance layer having a refractive index that is 95% or more and less than 100% of the refractive index of the electroluminescent layer; and
a light extraction layer located on a side opposite to the electroluminescent layer with respect to the first electrode layer, wherein
the reflective layer includes
a base material having a refractive index equal to or higher than a refractive index of the electroluminescent layer, and
filler particles each having a refractive index different from a refractive index of the base material, and
the base material includes a matrix and auxiliary filler particles.

2. The light-emitting device according to claim 1, wherein a refractive index of the second electrode layer is equal to or higher than the refractive index of the electroluminescent layer.

3. The light-emitting device according to claim 1, further comprising:
a substrate located on a side opposite to the electroluminescent layer with respect to the first electrode layer.

4. The light-emitting device according to claim 1, wherein the filler particles each have the refractive index lower than the refractive index of the base material.

5. The light-emitting device according to claim 1, wherein the filler particles each have the refractive index higher than the refractive index of the base material.

6. The light-emitting device according to claim 1, wherein an average particle diameter of the filler particles is 0.1 µm or more and 10 µm or less.

7. The light-emitting device according to claim 1, wherein the auxiliary filler particles have a higher refractive index than the matrix, and
an average particle diameter of the auxiliary filler particles is 0.005 µm or more and 0.05 µm or less.

8. A light-emitting device comprising:
a first electrode layer having light transmissivity;
a second electrode layer opposed to the first electrode layer, the second electrode layer having light transmissivity;
an electroluminescent layer between the first electrode layer and the second electrode layer and emitting light;
a reflective layer located on a side opposite to the electroluminescent layer with respect to the second electrode layer and diffusely reflecting the light; and
a low-refractive index layer between the electroluminescent layer and the reflective layer, the low-refractive index layer having a lower refractive index than the electroluminescent layer, wherein
the reflective layer includes:
a base material having a refractive index equal to or higher than the refractive index of the low-refractive index layer, and
filler particles each having a refractive index different from the refractive index of the base material, and
the base material includes a matrix and auxiliary filler particles.

9. The light-emitting device according to claim 8, wherein the low-refractive index layer transmits part of the light and reflects other part of the light on a surface thereof on a side of the electroluminescent layer.

10. The light-emitting device according to claim 8, wherein
the low-refractive index layer is located between the reflective layer and the second electrode layer.

11. The light-emitting device according to claim 8, further comprising:
a light extraction layer located on a side opposite to the reflective layer with respect to the low-refractive index layer.

12. The light-emitting device according to claim 11, wherein
the light extraction layer is located between the second electrode layer and the low-refractive index layer.

13. The light-emitting device according to claim 11, further comprising:
a substrate located on a side opposite to the electroluminescent layer with respect to the first electrode layer, wherein
the light extraction layer is located between the substrate and the first electrode layer.

14. The light-emitting device according to claim 11, wherein
the light extraction layer is in contact with the low-refractive index layer.

15. The light-emitting device according to claim 8, wherein
the thickness of the low-refractive index layer is 1 µm or more and 1 mm or less.

16. The light-emitting device according to claim 8, wherein
the low-refractive index layer includes an air layer.

17. The light-emitting device according to Claim 8, wherein
an average particle diameter of the fillers filler particles is 0.1 µm or more and 10 µm or less.

18. The light-emitting device according to Claim 8, wherein
the base material includes a matrix and auxiliary filler particles having a higher refractive index than the matrix, and
an average particle diameter of the auxiliary filler particles is 0.005 µm or more and 0.05 µm or less.

* * * * *